United States Patent
Brooks et al.

(10) Patent No.: US 7,578,392 B2
(45) Date of Patent: Aug. 25, 2009

(54) INTEGRATED CIRCUIT WAFER PACKAGING SYSTEM AND METHOD

(75) Inventors: Ray G. Brooks, Bedford, TX (US);
Timothy W. Brooks, Arlington, TX (US)

(73) Assignee: Convey Incorporated, Euless, TX (US)

( * ) Notice: Subject to any disclaimer, the term of this patent is extended or adjusted under 35 U.S.C. 154(b) by 675 days.

(21) Appl. No.: 10/859,720

(22) Filed: Jun. 3, 2004

(65) Prior Publication Data
US 2005/0269241 A1    Dec. 8, 2005
US 2008/0185315 A9    Aug. 7, 2008

Related U.S. Application Data

(60) Provisional application No. 60/476,790, filed on Jun. 6, 2003.

(51) Int. Cl.
*B65D 85/30* (2006.01)

(52) U.S. Cl. .................. 206/710; 206/521; 206/832

(58) Field of Classification Search ............... 206/710, 206/303, 723, 445, 453, 454, 477, 478, 480, 206/1.5, 521, 591; 215/321; 220/4.21
See application file for complete search history.

(56) References Cited

U.S. PATENT DOCUMENTS

| | | | | |
|---|---|---|---|---|
| 5,317,789 A | * | 6/1994 | Levy | ............................ 24/303 |
| 5,553,711 A | | 9/1996 | Lin et al. | |
| 5,724,748 A | | 3/1998 | Brooks et al. | |
| 5,725,100 A | * | 3/1998 | Yamada | ....................... 206/710 |
| 5,836,454 A | * | 11/1998 | Evers | ........................... 206/723 |
| 6,286,684 B1 | | 9/2001 | Brooks et al. | |
| 6,988,620 B2 | * | 1/2006 | Haggard et al. | .............. 206/710 |
| 6,988,621 B2 | * | 1/2006 | Forsyth | ....................... 206/710 |
| 2003/0213716 A1 | | 11/2003 | Cleaver | |

FOREIGN PATENT DOCUMENTS

| WO | PCT/US2004/014659 | 5/2004 |
|---|---|---|
| WO | WO 2005/001890 | 1/2005 |
| WO | WO2005001890 | 1/2005 |

OTHER PUBLICATIONS

U.S. Appl. No. 60/476,790, filed Jun. 6, 2003, Brooks et al.

(Continued)

*Primary Examiner*—J. Gregory Pickett
(74) *Attorney, Agent, or Firm*—Geoffrey A. Mantooth

(57) ABSTRACT

A packaging system, hereinafter referred to as the Critical Packaging System, relates to critical issues that associate with sensitive articles such as IC wafers before, during and after shipment phases. The system employs a choice of two or more specialty designed containers, and any one selected design having choices of two or more methods by which to avoid, reduce and/or eliminate wafer damage from breakage, scratches and/or corrosion during shipment phases. For the purpose of maximizing product yield during packaging phases a special apparatus is used to insert wafers within containers without scratch damage. The following programs are used in packaging: (1) Quality Assurance/Certification, (2) Critical Factor Monitoring, and (3) a Recycle and Refurbish Program. These programs are specifically designed to achieve new levels of product yields, reduce product cost, and landfill impact.

8 Claims, 39 Drawing Sheets

OTHER PUBLICATIONS

Letter from applicant disclosing documents he believes relevant to the application, 5 pages.
Attachment #1—confidentially and nondisclosure Agreement—3 pages.
Attachment #2 Manuel for Critical Packaging system—the system of the present invention.
Attachment #3—From U.S. Appl. No. 60/479,086, filed Jun. 17, 2003.
Attachment #5—Brooks box Invention demonstrated to Forsyth on May 5, 03.

* cited by examiner

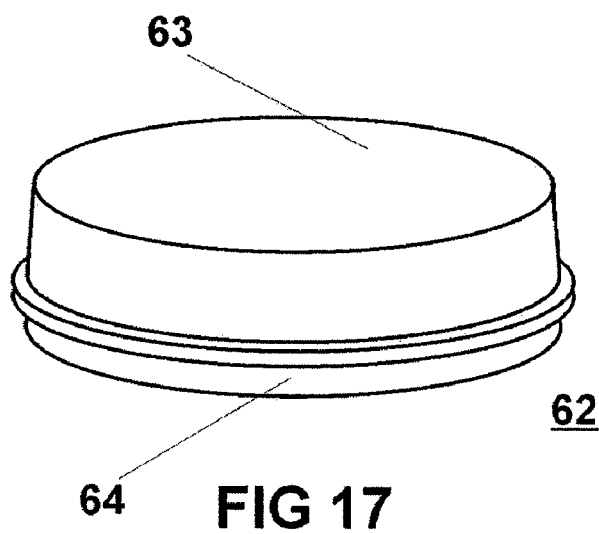
FIG 17
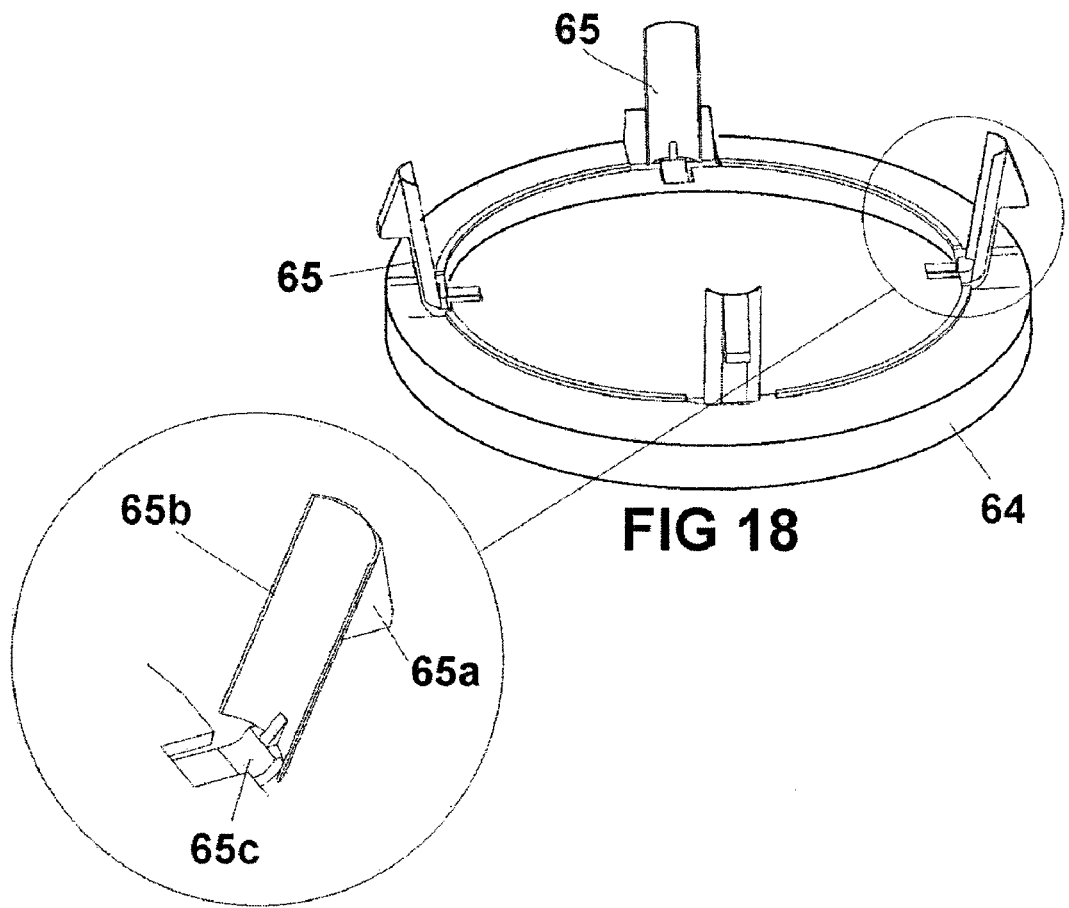
FIG 18
FIG 19

Locking Position

Un-Locking Position

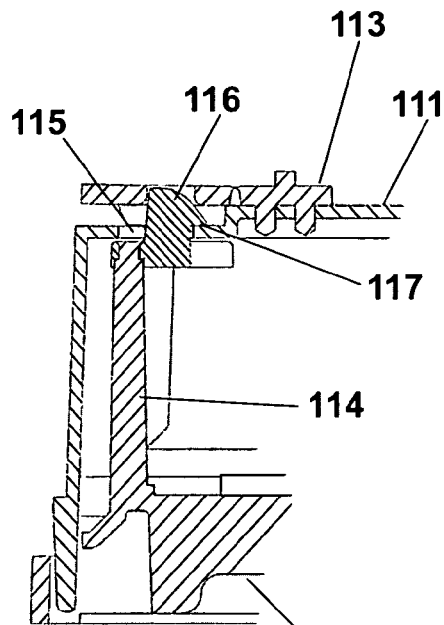
FIG 38
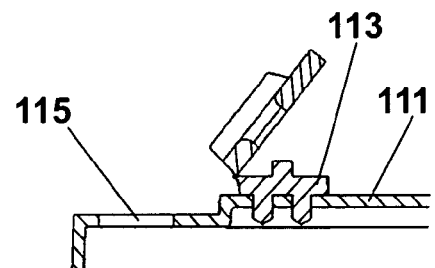
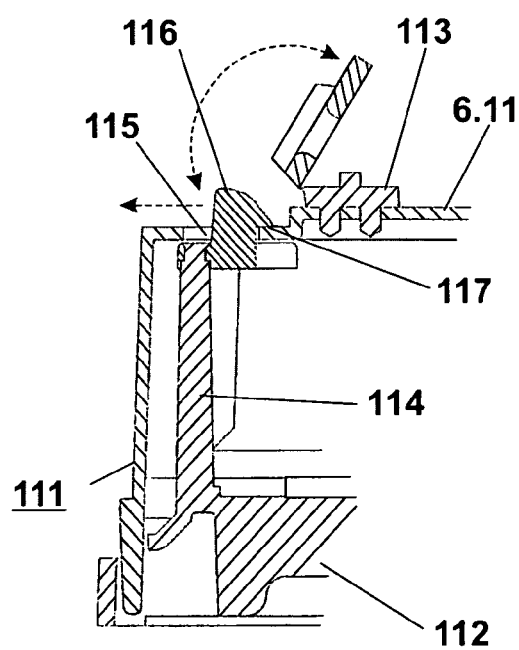
FIG 39
FIG 40

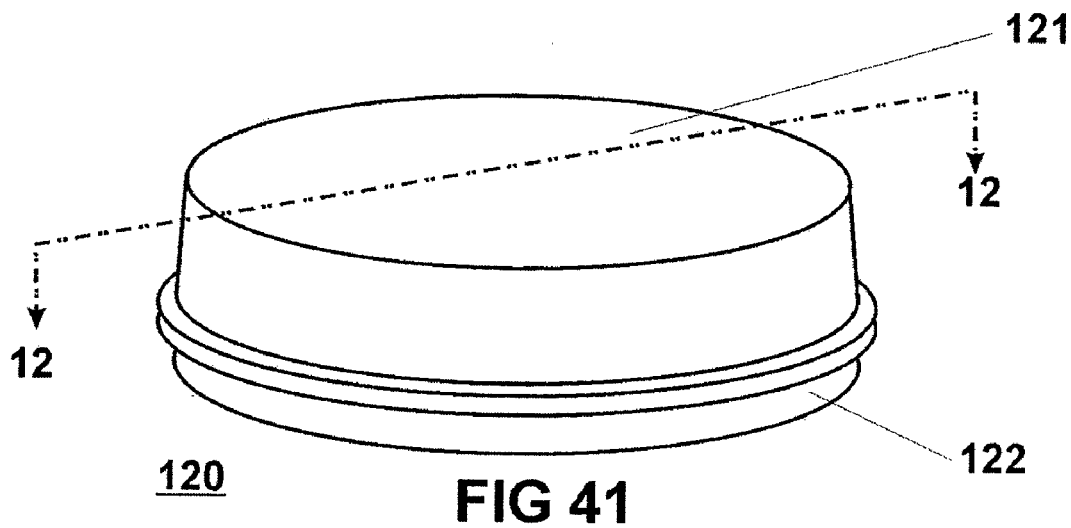
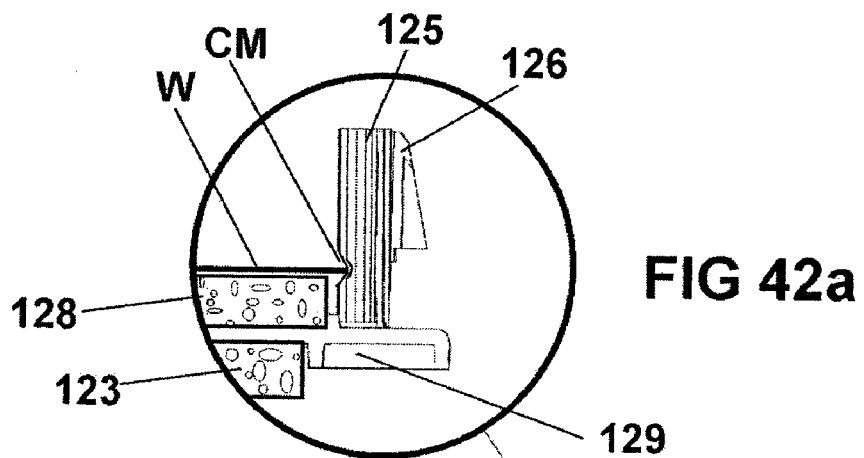
FIG 42a
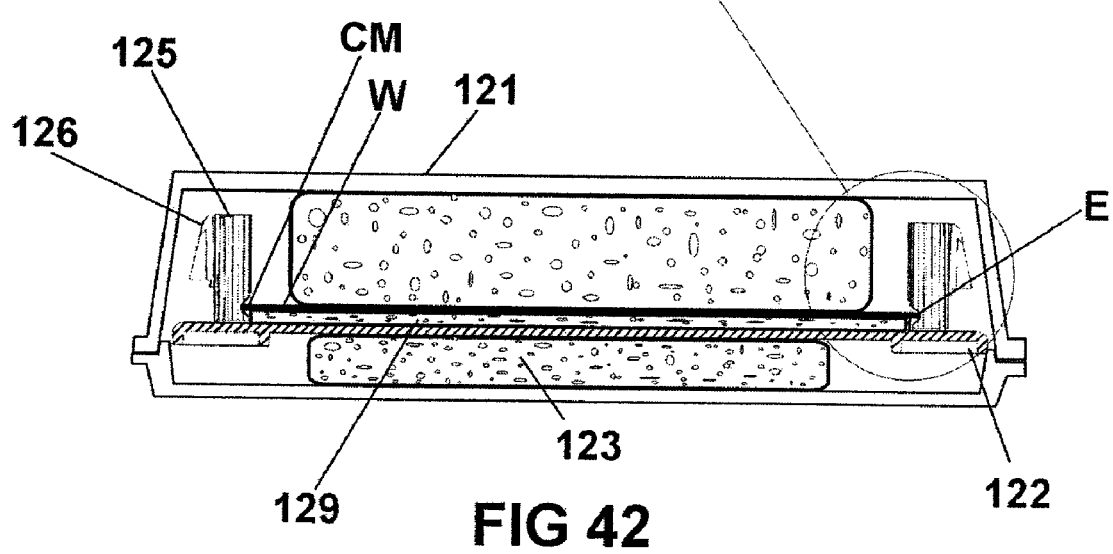
FIG 42

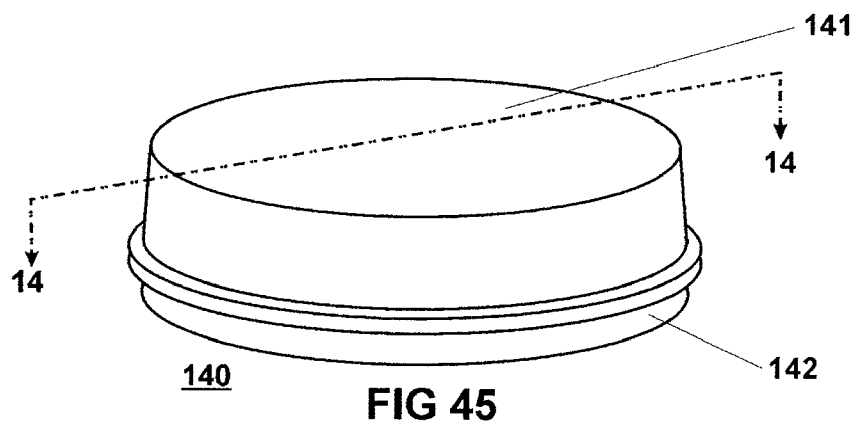
FIG 45
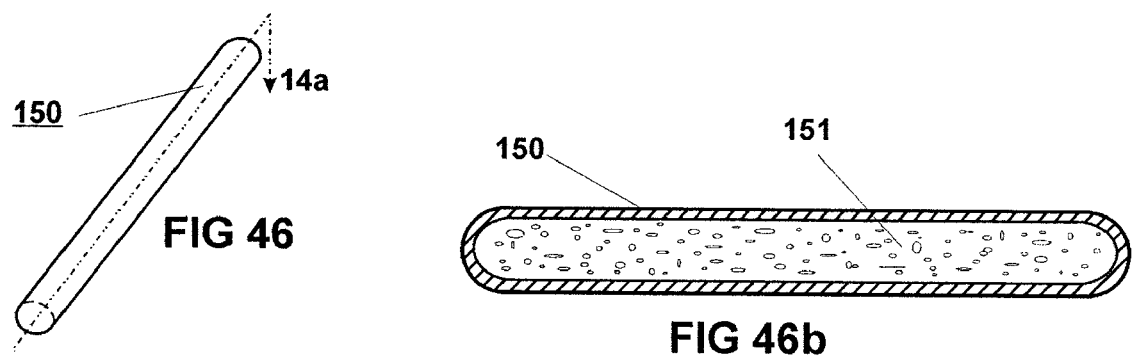
FIG 46
FIG 46b
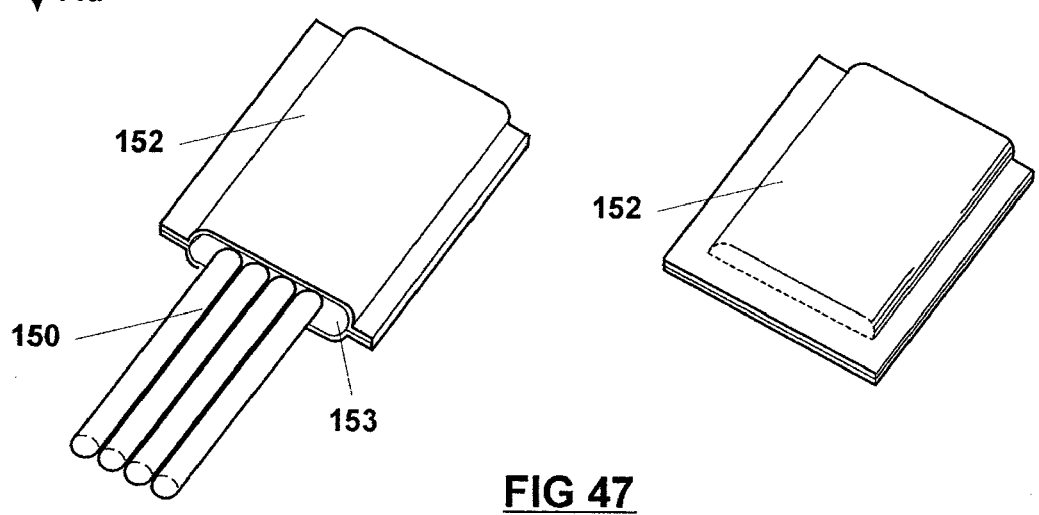
FIG 47

INTEGRATED CIRCUIT WAFER PACKAGING SYSTEM AND METHOD

This application claims the benefit of U.S. provisional application Ser. No. 60/476,790, filed Jun. 6, 2003.

FIELD OF THE INVENTION

The invention relates to semiconductor wafer packaging and transportation system, and more particularly to a packaging system and method of packaging sensitive articles such as semiconductor wafers to prevent damage to the wafers before, during and after storage/shipment phases.

BACKGROUND OF THE INVENTION

To date, the semiconductor industry has been able to produce IC wafers increasing functional capabilities and increasing density without necessarily suffering losses during the transport processes, or at least having not realized the packaging media as a source for those losses. In general, present day transport media designed for packaging IC wafers are lacking the necessary features to address several problems common to advanced technology wafers during insertion and transport. This is especially true for wafers having higher speed with smaller geometries and having elevated interconnect members including bond pads, caps, and balls. These problems can manifest themselves in the form of disfigured connectors that include wafer breakage, scratch damage as well as mobile ion induced parametric failures.

Wafer shipping containers/boxes in combination with bags, outer cardboard type boxes, cushions and separators that are not functionally coordinated nor objectively systematized to address wafer movement, Airborne Molecular Contaminants (AMCs), and vapor leakage during transport can cause yield problems to the semiconductor wafers. Yield problems are associated with the following problems.

Wafer Movement:

Wafer boxes/containers currently utilize oversized vertical wall configuration to accommodate insertion of wafers without restrictions. The walls normally are unable to move inward to take up the slack after the box is fully loaded. The resulting wafer movement, when combined with wafers that utilize soft thin protective overcoats and elevated soft pads, caps and/or ground rings, can result in scratching during the wafer insertion and transport process. Stacked wafers with elevated features may also transfer structural damage to other associated wafers if improper materials are selected with too soft or too stiff a compressibility factor. Partial loading of a box changes the compressibility requirements of the system so that simply adding more cushions may not be the most appropriate solution.

The movement of wafers within the transport media generate shaved particles that enhance scratch damage and promote slough particles.

These particles, with the presence of AMCs, can further enhance the possibility for surface contamination. These contaminates may lead to corrosive damage and/or transistor inversion.

AMCs are exceptionally small in size they are generally corrosive and they carry a charge. Through molecular migration, a charge build may occur over an active transistor node resulting in transistor inversion and a parametric failure. These type defects generally are latent in nature, may be identified at final test, but usually appear as field returns or through extended life test analysis. The failure mechanism will disappear upon removal of the encapsulation media, removing any evidence that may suggest the source of the contamination. There will be no clear path leading back to the transport media system as a source of the problem.

Scratch Damage During Insertion

A robotic system transferring a wafer through the insertion process allows some lateral movement of the inserted wafer. This movement (from direct drop or placement) transfers through the underlying separator and to the top surface of the covered wafer. The impact, depending on the weight of the wafer and the amount of trapped air, will result in some amount of uneven force as the two surfaces come in contact with each other. The allowed lateral movement during the insertion will result in scratch damage. These scratches are typically sub-micron in size and may further migrate through the passivation oxide when cushion compressive forces are developed while closing the box. This type of crazing damage is not necessarily catastrophic, and it is unknown if such forces act to create catastrophic failure during extended life testing. Nor is it understood if this sub-micron crazing can later become a point of entry for corrosive growth. It is known that such damage has been witnessed at the bevel edges of the wafers.

Scratch Damage: Smeared or Scratched Circuit Lead Scratches

During transport, lateral movement of wafers within containers/boxes will scratch wafer surfaces during shipment. The resulting scratches will cause damage to interconnect circuitry including smashing and disfiguring elevated connecting members such as ground rings, ball bond pads, and caps. These scratches can form shorts from one metalized area to another. The same lateral movement will also create shaving from the protective separators which further promotes scratch damage.

Wafers packaged within boxes should have no allowance of lateral motion during shipment phases to avoid concerns of damaged elevated circuitry.

Corrosive Damage

Wafers packaged within enclosures such as boxes and bags that have a high level of MVTRs (moisture vapor transport rate) when trapped within those enclosures that excessively out-gas Airborne Molecular Contaminants (AMCs), in combination can create corrosive residues that are able to settle on the surface. Those corrosive residues can move in the direction of bond pads and any other exposed metallization to create damage, either immediately or as a latent defect when later placed used bias and able to migrate over an active node to create transistor inversion.

The amount of corrosive damage that transfers to a surface depends upon the abundance of AMCs that associate with the packaging materials and barometric pressure, temperature and relative humidity that modifies the MVTR assigned to the boxes and bags containing the wafers. Evidence of corrosion entry include (1) edge & bevel missing metal, (2) lifted pads, (3) stained pads, and (4) dark corroded pads.

Within a finished 16/300 dip product, the molecular transfer of hydrogen and oxygen ($H_2O$) molecules through the encapsulate occurs under 168 hours at room ambient and 50% RH. The finished product, when placed under bias, activates molecular movements of the ions which tend to migrate to various transistor nodes. Assuming no cracks or crazing have occurred to the passivation, the charge build that gathers above the transistor node may result in the transistor inverting, leading to a parametric circuit failure. The rate of mobilization depends on the bias voltage, time of on state, and content of AMCs within the vapor transfer at the passivation surface. Processes leading up to the encapsulation process do not normally impact the attachment of these charged ions on the surface of the passivation. Generally these AMCs have already attached themselves to the oxide so that saw and grind slurry and their respective cleanups accomplish little to achieve removal.

Stained Bond Pads

For wafers packaged within shipping containers, there are instances where bond pads and adjacent passivation coatings will accumulate contamination that appears as a stain. The stain appears to extend beyond bond pads under the passivation coated areas. This contamination condition seems to be traceable to a mismatch between photo-resist and the passivation coating usually found in the bond pad areas. Due to the mismatch of the passivation, a chemical reaction driven by the presence of moisture vapors combined with organic type AMCs, such as contaminating hydrocarbons, allows for the first stage of corrosion to begin.

Clean rooms are teeming with AMCs that cannot be effectively removed by HEPA filters. When wafers are packaged within boxes having moisture vapors that have not been fully removed, those bags become carriers for AMCs, settling on all surfaces including bond pads and over-coating passivation. A small amount of chemical reaction takes place with the exposed aluminum or copper surface, thereby resulting in a corrosive stain in the area of bond pads as well as in any area where a mismatch between the photo-resist and the PO coating occurs.

Corrosive Bond Pads

Surfaces of bond pads that become excessively corroded while in transit from one location to another may become unnecessarily exposed to the condition of AMCs. This damage is normally restricted to bond pad surfaces only and normally is associated with the presence of moisture vapors. Sources with the transport system may include the out-gassing of cushions and/or separators. This out-gassing may be linked to inorganic and organic type AMCs resulting in the corrosive damage.

SUMMARY OF THE INVENTION

The method of packaging called the Critical Packaging System herein referred to as the CP System, is the consummate answer or correction for packaging IC wafers for shipment from one location to another location. The CP System is exceedingly unique in that its main feature focuses on wafer-shipping boxes known as WEC BOXES. These boxes/containers come in two or more styles and are unique because they are designed in a manner to provide choices by which to systematize a solution for critical problems known to reduce product yields. This systematized concept is a fine-tuned method to simultaneously provide: (1) Pre-calculated Cushion System that automatically accommodates varying quantities of packaged wafers and eliminates the present-day requirement for foam cushions having different thickness, (2) Anti-Movement Wafer Concept designed to reduce scratch damage, (3) Absorb shock/stress energy that exceeds performance of present-day cushions, (4) Adsorb AMCs to reduce corrosive damage to bond pads during shipping phases, (5) Recycle Program, (6) Positive Locking System designed to provide the utmost security for packaged wafers and Carbon-Leafs that are separators having a membrane to avoid carbon sloughing and that is a key component of the CP System in that this concept becomes a part of the wafer packaging system and immediately addresses Airborne Molecular Contaminants. Specifically CPS is designed to simultaneously address $21^{st}$ Century critical problems such as: (1) Gold/Solder Bump Pad Damage, (2) Lead Damage, (3) Edge & Bevel Contamination, (4) Lifting of Gold/Solder Bumps, (5) Stained Bond Pads (6) Corrosive Bond Pads and (7) Wafer Breakage.

Another object of the CP System invention is for packaging IC wafers within special containers which may have different configurations to accommodate different packaging requirements and special moisture barrier bags having combined features to optimize product yields during shipment phases. The CP System invention, as defined herein, provides a choice of specially designed containers from which to make a selection to address critical issues that become major problems for wafers during shipment phases. The selection within the concepts of the CP System is made to suit the critical issues by which to optimize yields of packaged wafers. A bag, in combination with a container of choice becomes the system for stripping moisture vapors from interior walls of both enclosures. In accordance with this invention, said container selection addresses at least three or more critical issues that cause damage to packaged wafers during shipment phases and said damages are but are not limited to: 1) corrosion, 2) breakage 3) scratches, (4) structural, (5) improper packaging and (6) particle contamination. The key component of the CP System invention is that all containers in combination with bags have the common design to minimize forces that create motion causing surface damage and minimize moisture vapors causing corrosive damage during shipping phases. Moreover, the features of the Critical Packaging System are specifically designed for the IC Wafers that have much smaller geometries with much faster speeds that require a different packaging methodology to address and correct critical issues during shipment phases. Therefore, the selection of the container in accordance with this invention is tailored to optimize the desired level of wafer protection during shipment.

A further object of the invention is to provide a selection of at least two or more different and distinctly designed wafer shipping containers combined with two or more means/apparatuses by which said selection accommodates the objectives of CP System at a level that corrects critical problems and optimize the protection of packaged wafers during shipment phases. For an example, one variable design of the container utilized in the CP System in at lease one embodiment includes a special moisture barrier bag that becomes a total enclosure within the container, which in combination avoids damage problems caused by AMCs, oxidation, breakage and scratches during packaging and shipping phases.

Another object of the invention is to provide methods within the Critical Packaging System that become the means to absorb or abate corrosive AMCs that decrease the quality of bond pad surfaces, reduce bond pad oxidation to increase bonding quality, restrict lateral motion of packaged wafers to decrease scratched surfaces and absorb shock energy to decrease breakage damage resulting in increased product yields.

Another object of the invention is to provide a moisture barrier bag to hold said container and whereby said bag has a septum that communicates directly with a matching inlet valve on said container. This is the means to introduce a dry gas through film walls of said bag directly into the container interior by which becomes the means to strip moisture vapors. The moisture barrier bag can be sealed after venting said stripped vapors from a container and becomes a means to enhance bonding ability for wafers packaged therein.

A further object is to provide a box/container of choice within the CP System invention that provides a means to absorb or abate AMCs that associate with packaging materials, people, clean room contaminants and process equipment. Said means is at least one breakable glass vial holding absorption materials such as activated charcoal that becomes a "getter" to absorb or abate ionic contaminants. The vial(s) are mounted in the bottom cover of said container in a manner to become breakable when a floating receptacle is depressed prior to wafer packaging.

A further object of the invention is to provide a box/container of choice that may include a unique polymer spring or a High Energy Absorption cushioning bag holding air that absorbs excessive stress and shock energy at the assigned spring rate while simultaneously accepting 1 to 25 wafers during shipment phases.

The above mentioned objects are means and methods that may be used in various combinations to provide a shipping container of choice that in combination with a shipping bag has the combined features to eliminate forces caused by handling, to eliminate or seriously minimize motion between wafer surfaces during shipment phases, while simultaneously eliminating or seriously minimizing corrosive AMCs and moisture vapors that corrode and oxidize bond pads in combination with the ability to absorb shock energy that breaks wafers caused by mishandling during the shipment phases.

BRIEF DESCRIPTION OF THE DRAWINGS

FIG. 17 shows an isometric view of a another container that restricts wafer motion on the X-Y axis during shipment;

FIGS. 18 and 19 show the details of the angled posts that restrict the motion of the wafer during shipment;

FIGS. 38, 39 and 40 are partial cross-section views taken through section 11-11 of FIG. 37;

FIG. 41 is an isometric view of an embodiment of the invention for isolating wafers to prevent damage to the wafer;

FIG. 42 is a cross-sectional view of FIG. 41, taken through section 12-12;

FIG. 42a is a partial view of the cushion mechanism for securing the wafer;

FIGS. 45-49 illustrate a wafer shipping box/container;

DESCRIPTION OF THE PREFERRED EMBODIMENTS

The invention is a container for shipping and/or storing semiconductor wafers to prevent damage to the wafers. A first embodiment of the invention is illustrated in FIGS. 1, 2, 3, and 4. The box or container is referred to as WEC (Wafer Environmental Control) Box that is designed to comply with all the features of the CP System. The box/container is molded of a synthetic resinous material such as ABS and is designed in a manner to accommodate and resolve critical issues such as contaminating Airborne Molecular Contaminants, directional forces during shipment phases that create motion for packaged wafers that cause surface damage and means to absorb shock energy caused by mishandling, all of which occur during shipment phase.

Figure 1:
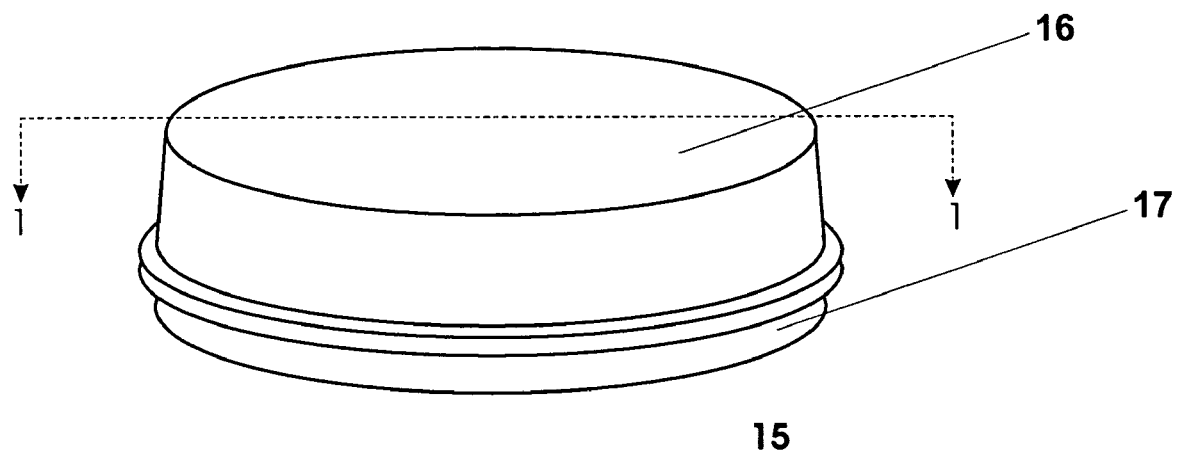
FIG. 1 is an isometric view of a container having a locking ring with vertical finger members for locking and unlocking of top cover to bottom cover.

FIG. 1 is an isometric view of an embodiment of the invention. FIG. 1 shows a Box/container 15 with a top cover 16 and a bottom cover 17.

Figure 2:
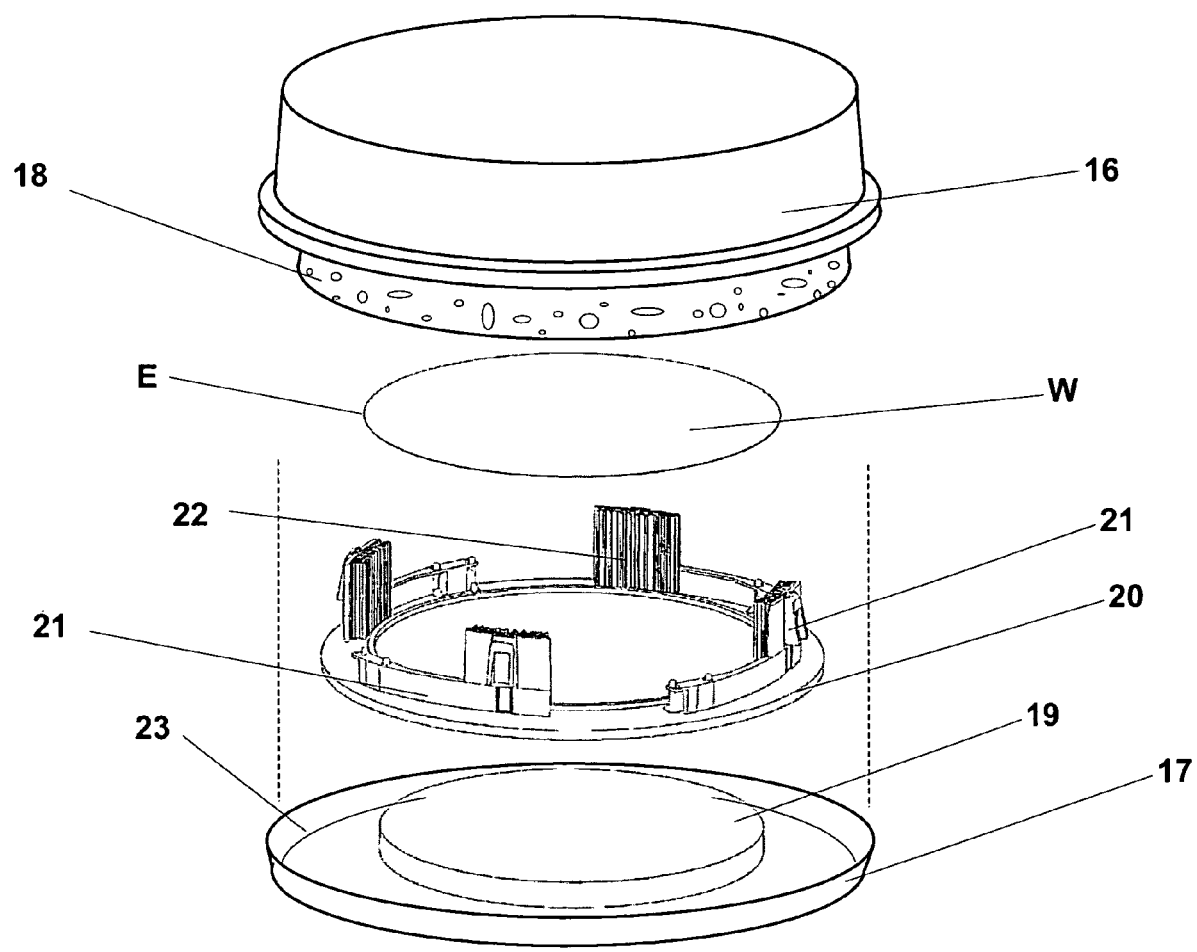
FIG. 2 is a container showing the top cover and bottom cover of the container separated to show a floating receptacle, and vertical members with rubber bumpers.

FIG. 2 is an exploded view of box 15, showing the basic components of the box/container. There is a bottom cover 17 onto which a foam cushion 19 is placed in cavity 23. Floater plate 20 is placed in bottom cover 17 over a foam cushion 19. Wafer W, with edges E, is placed in floater place 20, and is held in position by several vertical member assemblies 21, each assembly 21 has a rubber bumper 22 which is moved against wafer edges E to hold the wafer in an immovable position. A second foam cushion 18 is placed over the wafer and top cover 16 is placed over and, in conjunction with bottom cover 17, encloses the floater plate and wafer, and cushions 19 and 18.

Figure 3:
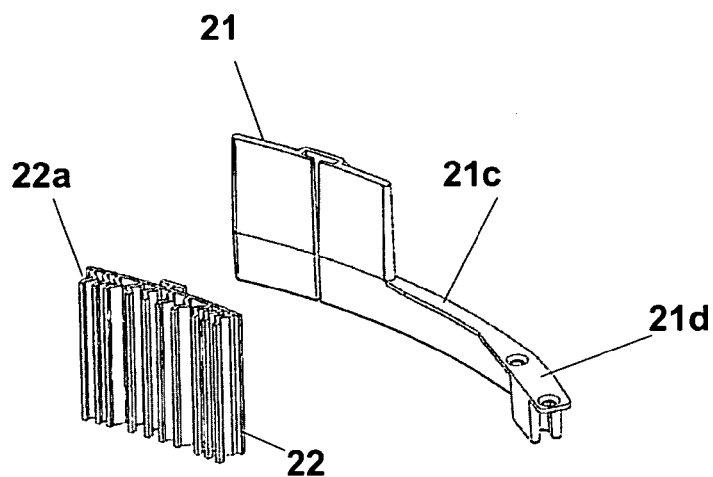
FIGS. 3, 3a and 3b show the details of the bumper members.
Figure 3A:
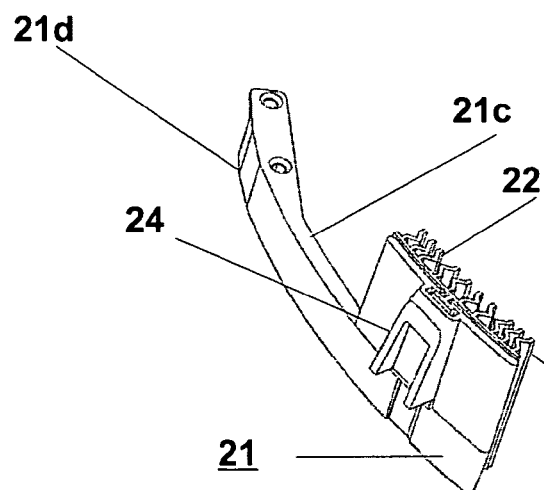
Figure 3B:
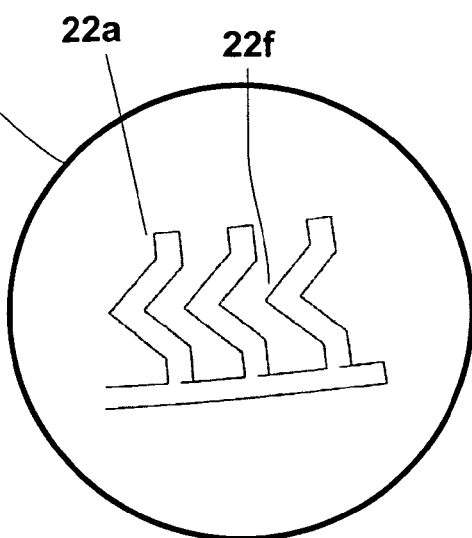

As shown in FIGS. 3, 3a and 3b, each vertical member 21 has a rubber bumper 22 has multiple fingers 22f (FIG. 3b), each said finger 22f has an accordion shape. The ends of fingers 22f are moved against the edge E of the wafer W, flexing to hold the wafer W in place without damaging the edge of the wafer. Each vertical member has an extension arm 21c and a cam 24. As will be described in relation to FIG. 4, each extension arm 21c, pivotally attached to floater plated 20 at end 21c, is movable to allow the fingers 22f of bumper 22 to move against wafer W.

Figure 4:
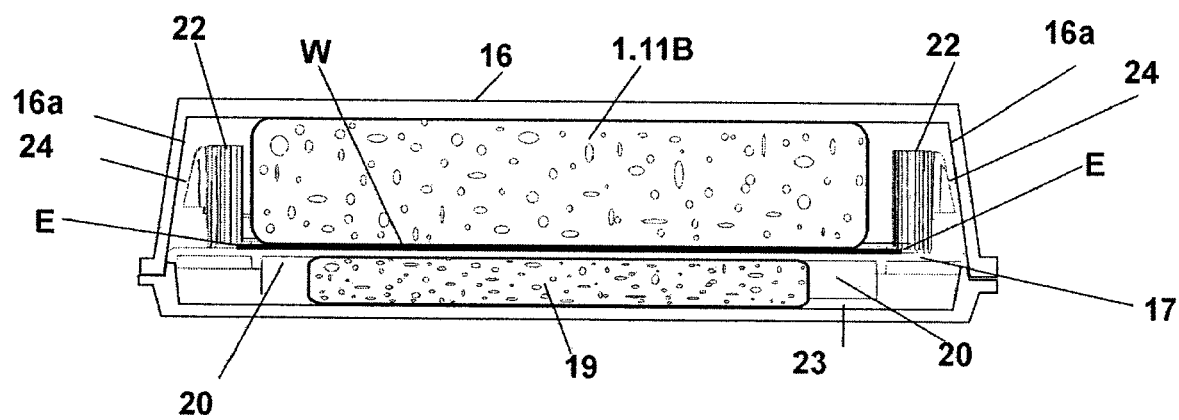
FIG. 4 is a cross sectional view of the container taken along the lines of 1-1 of FIG. 1.

FIG. 4 is a cross-sectional view, taken along section line 1-1 of FIG. 1, of box/container 15 with top cover 16 and bottom cover 17 assembled to each with wafer W packaged within floater plate 20, and plate 20 supported by cushion 19. Top cushion 18 and of top cover 16 apply a constant downward pressure on Wafer W, floater plate 20, wafer 19 and bottom cover 17 to restrict motion in the Z axis".

Figure 5:
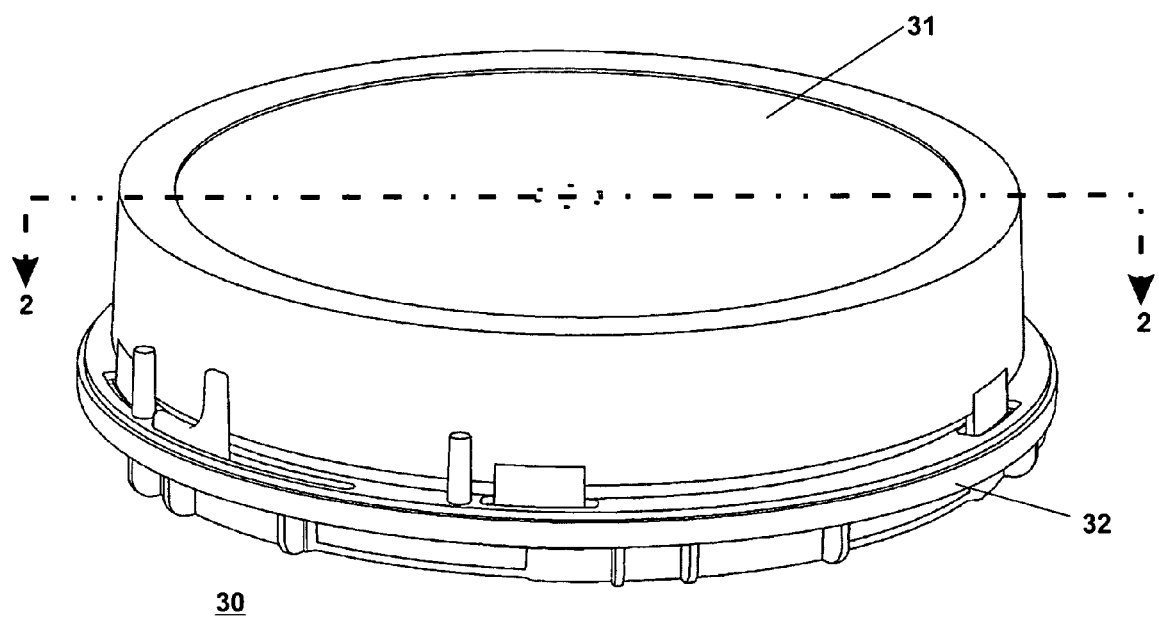
FIG. 5 is an isometric view of a container having a locking ring with vertical finger members for locking and unlocking of top cover to bottom cover.
Figure 6:
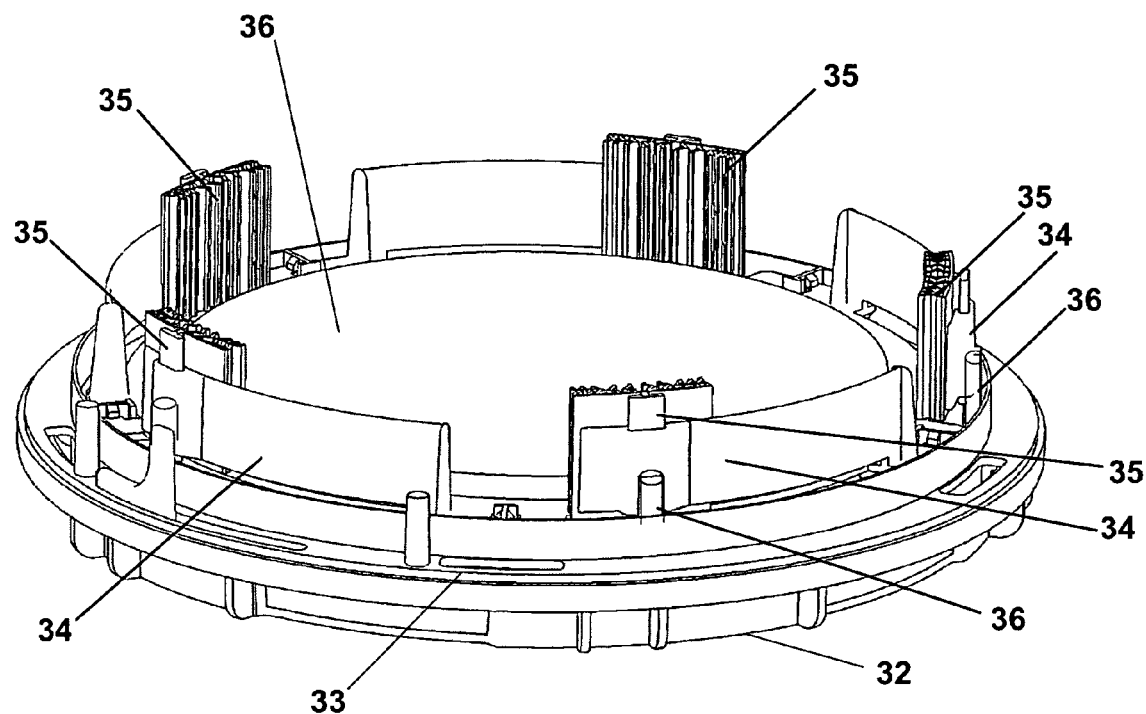
FIG. 6 shows the details of the bottom cover of the wafer carrier.
Figure 7:
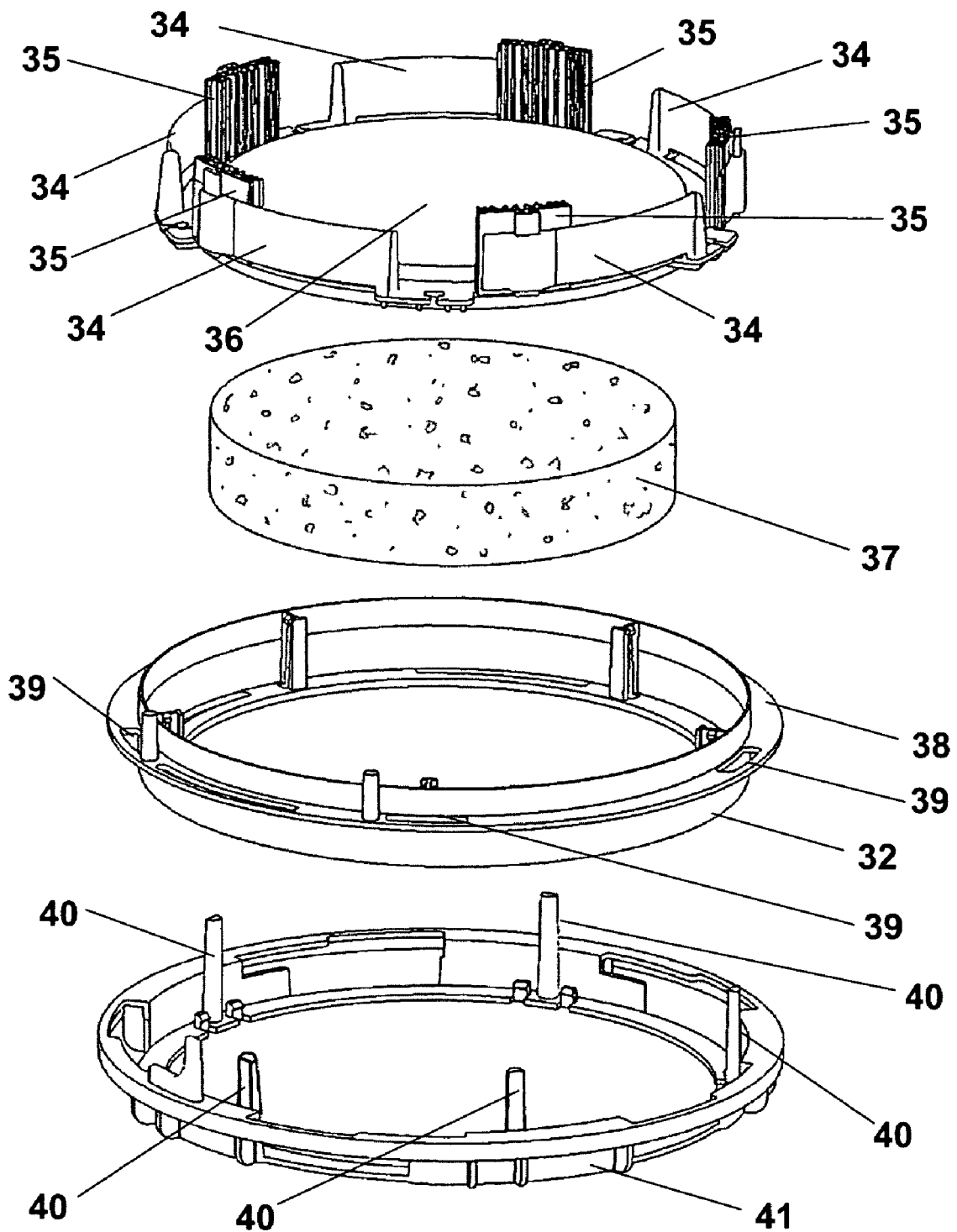
FIG. 7 is an exploded view of the container showing a top cover, two film frames and a bottom cover having a floating receptacle recessed therein.
Figure 8:
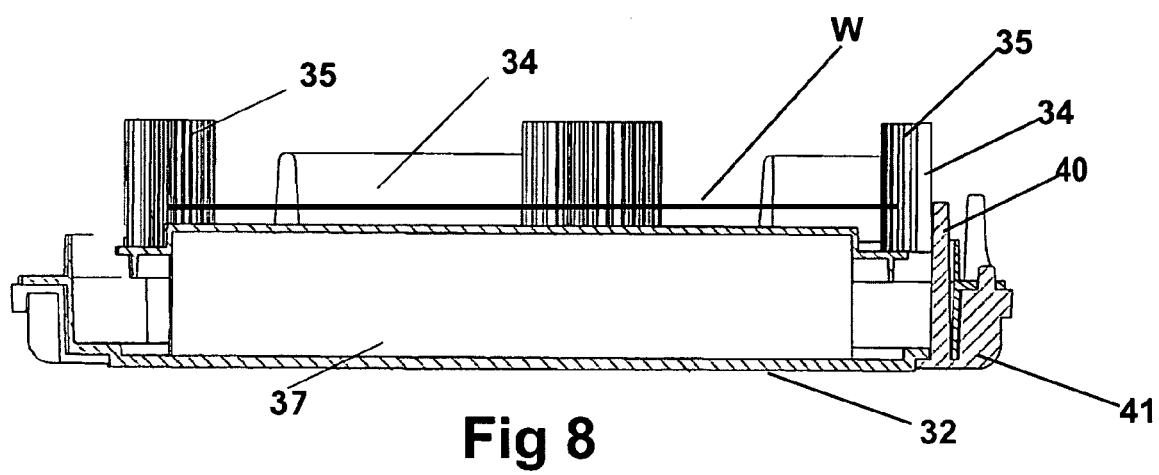
FIG. 8 is a cross sectional taken along the lines of 2-2 of FIG. 5.

Cam 24 has an angle similar to the interior wall 16a of top cover 16. Extension arm 21 and pivot end 21c are pivotally attached to floater plate 20. Vertical members 21 are moveable to allow bumpers 22 to contact edges E of said packaged wafers W when biased inward by top cover 16. When top 16 is mounted down and over the bottom cover 17 and floater plate 20, the vertical member assemblies 21 will actuate inward in a manner to cause intimately contact between rubber bumpers 22 and edges E of packaged wafers W, causing a gentle compression. This compression provides a means of "resiliency" by which to reduce or eliminate forces that create motion on the "X-Y" axis or "side to side motion" during shipment phases, thus reducing or eliminating surface damages such as "scratches FIGS. 5 through 8 show a Box/Container 30 having a purpose to restrict wafer motion on the X, Y and Z axis. Top cover 31 has in interior angled walls similar to 16a of FIG. 4, and a cushion similar to cushion 18 of FIG. 2. FIG. 5 shows the wafer shipping container with a top cover 31 and a bottom cover 32. The bottom cover 32, as shown in FIG. 6, and further illustrated in exploded view in FIG. 7, differs from the bottom cover 17 (FIGS. 1 and 2) in that there is a wide flange 38 with multiple apertures 39 that are aligned with vertical members 34 or said plate 1.12b. Bottom cover 32 has a broad flange 38 with multiple apertures 39 by which multiple cams 40 of cam plate 41 are movable apertures when mounted by means (not shown) of said bottom cover 32. Cross-sectional view of FIG. 8 taken along the lines of 2-2, shows cams 40 protruding through apertures 39 of bottom cover 32 for the purpose of biasing cams 40 to cause rubber bumpers 35 of vertical members 34 to come in contact with edges E of packaged wafers W causing a gentle compression that provides a means of "resiliency" by which to reduce or eliminate forces that create motion on the "X, Y and Z" axis during shipment phases, thus reducing or eliminating surface damages such as "scratches".

Figure 9:
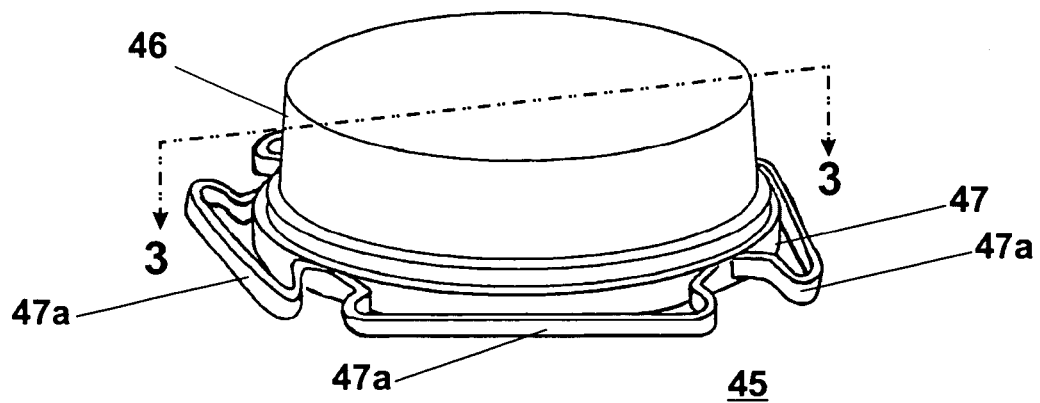
FIG. 9 is an isometric view of another embodiment of the invention.

FIGS. 9-12 illustrate another embodiment of the invention. FIG. 9 shows a container 45 with a top cover 46 and a bottom cover 47. Positioned around the periphery of bottom cover 47 are several flexible polymer bumpers 47a. Box/Container 45 is used to provide an economical container to restrict wafer motion during shipment phrases only on the X-Y axis. Flexible bumpers 47a prevent shock to the packaged wafers when the container 45 is hit from the side, the bumpers 47a being flexible, absorb any shock.

Figure 10:
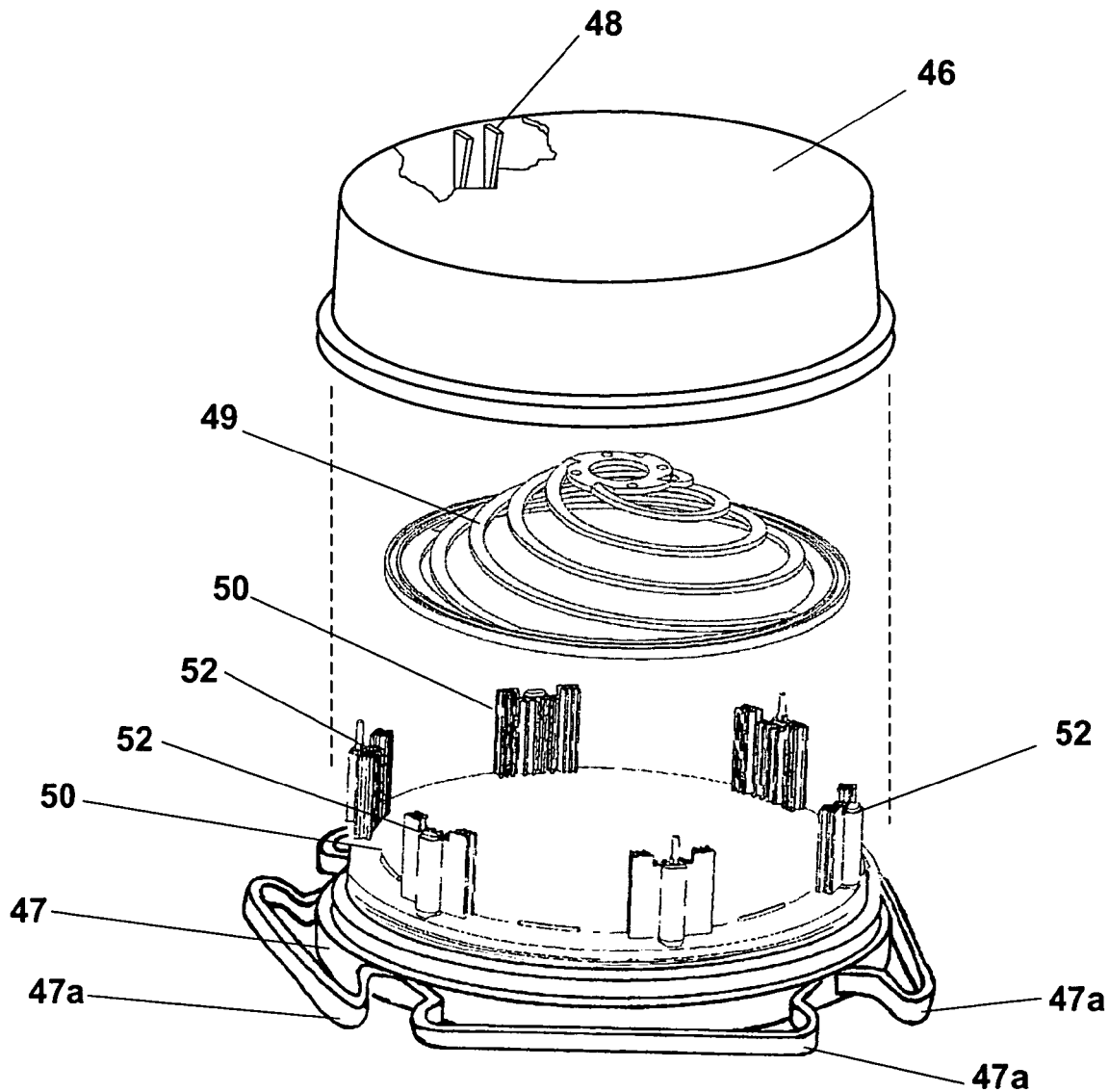
FIG. 10 is an exploded view of the container or FIG. 9.

FIG. 10 is an exploded view of container 45. Bottom cover 47, flexible bumpers 47a, has multiple vertical post assemblies 52 having attached rubber type bumpers 50. Each rubber bumper 50 has multiple fingers 51, each finger 51 has an accordion type shape to directly contact edges E of packaged wafers W (FIG. 12) with "resiliency" without damage. Bottom cover 47 has multiple vertical post assemblies 52 arranged in a circumferential manner to receive wafers W without restrictions or any kind of interference during hand or automated wafer-packaging. Each vertical post 52 is assembled with a rubber bumper 50 shown in sectional view FIG. 11 becomes biased by top cover 46 interior wall cams 48 so as to flex or move inward causing intimate contact with edges E of packaged wafers W causing a gentle compression C that provides a means of "resiliency" by which to reduce or eliminate forces that create motion on the "X-Y" axis surface that damages such as scratches". Polymer compression spring 49 is mounted over mounted wafers and under top cover 46.

Figure 11:
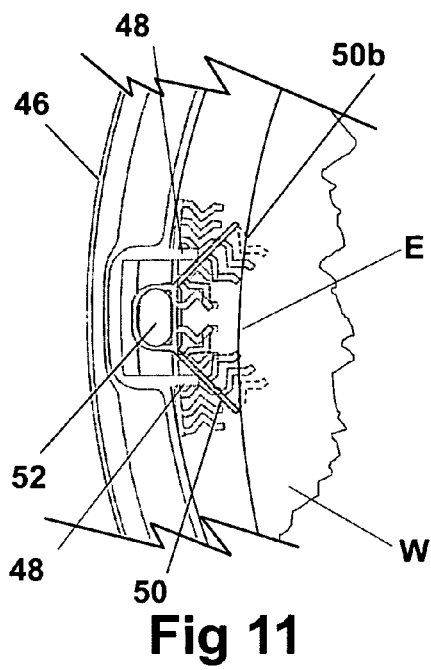
FIG. 11 shows a detail of the wafer rubber bumpers.

In FIG. 11, post assembly 52 with rubber bumper 50 and fingers 51 are shown engaging the edge E of Wafer W.

Figure 12:
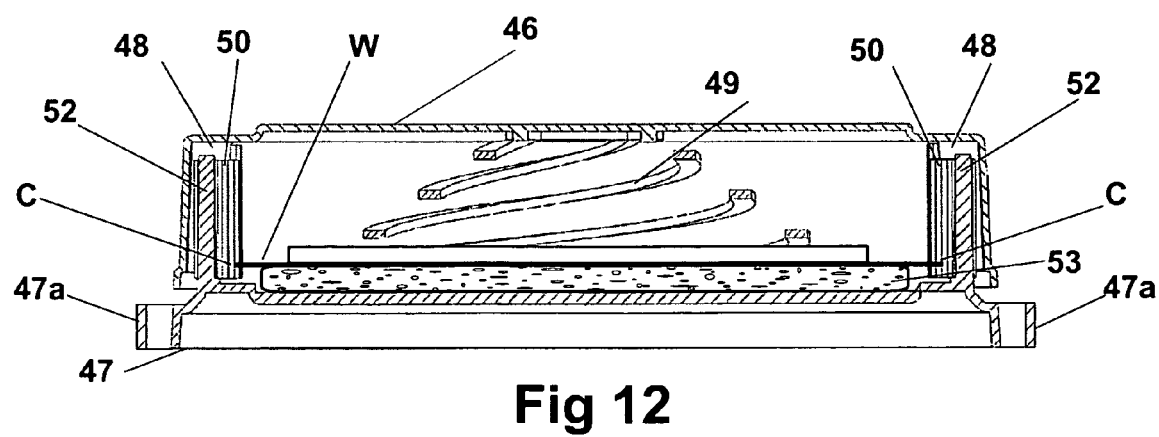
FIG. 12 is a cross sectional view taken along the lines of 3-3 of FIG. 9.

FIG. 12 is a cross-sectional view taken along the lines of 3-3 of FIG. 9. Polymer type spring 49 holds wafer W securely against cushion 53 to protect packaged wafers W from structural damage caused by shock energy due to box mishandling such as sudden drop. Downward pressure is exerted on spring 49 by top cover 46 as it is lower and attached to bottom cover 47. Spring 49 has the ability to automatically adjust and accept 1 up to 50 packaged wafers according to thickness without the concern shock energy transfer. When top cover 46 is placed over bottom cover 47, the cams 48 inside top cover 46 move each vertical post 52, and bumper 52 thereon against the edge E of wafer W.

Figure 13:
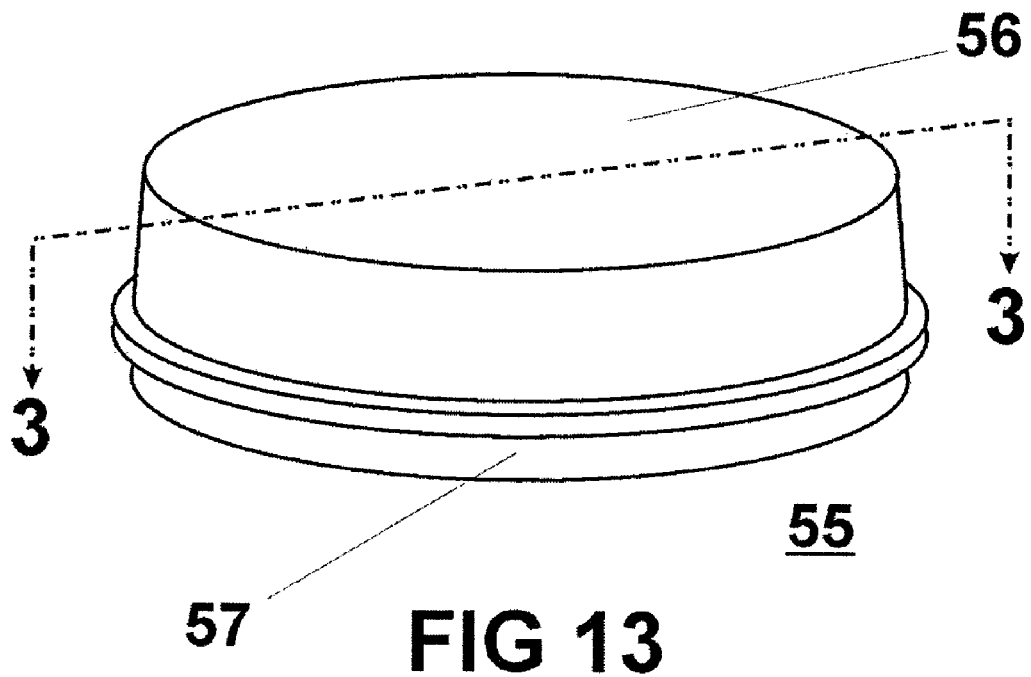
FIG. 13 is an isometric view of another embodiment of the invention.

FIGS. 13-16 show an economic container 55 for restricting wafer motion in the X-Y axis during shipment. The box/container assembly 55, as illustrated in FIG. 13 shows top cover 56 and bottom cover 57.

Figure 14:
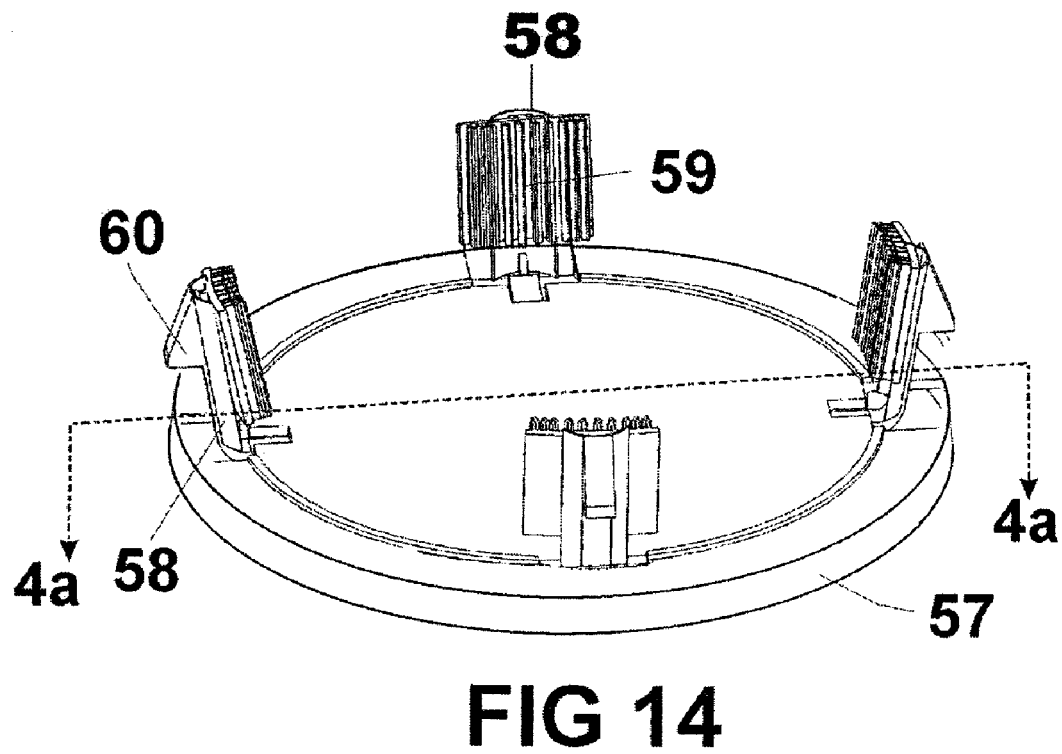
FIG. 14 shows the bottom cover of the embodiment of FIG. 13.

FIG. 14 shows the bottom assembly 57, which has a plurality of angled post assemblies 58; each post assembly 58 includes a rubber bumper 59 and a cam 60.

Figure 15:
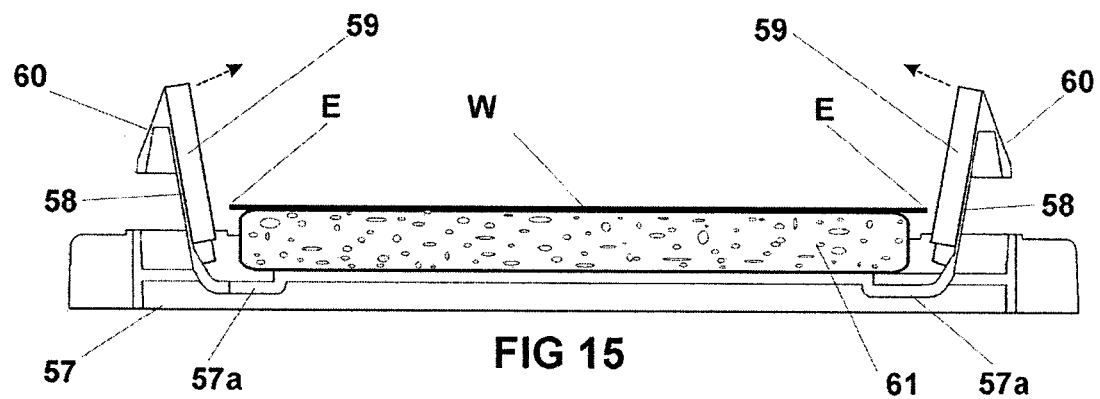
FIG. 15 is cross-section view taken through section 4-4 of FIG. 14.
Figure 16:
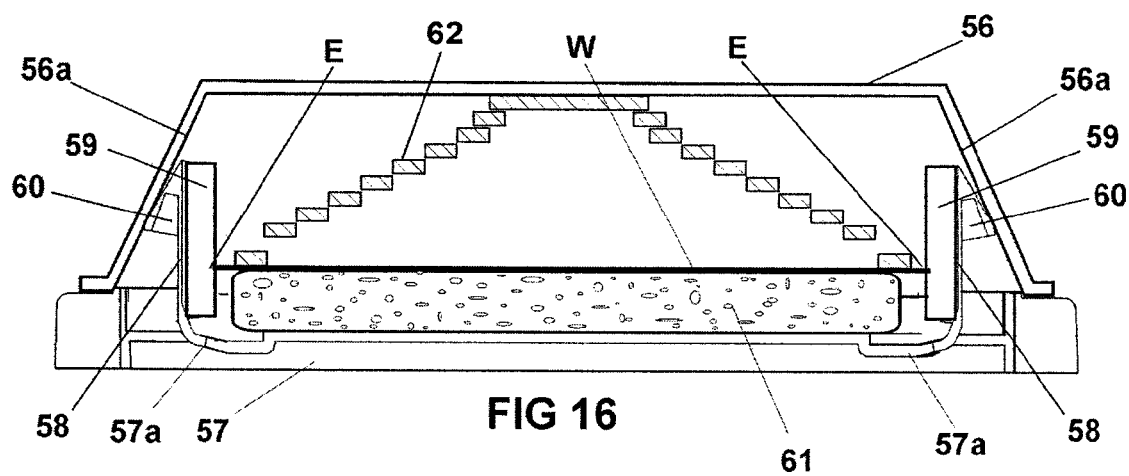
FIG. 16 is a cross-section view of the container of FIG. 13, taken though section 4-4.

FIG. 15 is a cross-sectional view taken along lines 4a-4a of bottom assembly 57 with a wafer W placed upon cushion 61. Angled posts 58 are angled outward and due to the flexibility of member 57a are movably inward when biased by interior of top cover. Angled posts 58 are arranged in a circumferential manner to receive wafers W without restrictions or any kind of interference during hand or automated wafer packaging. As illustrated in FIG. 16 (a cross-sectional view taken through section 4-4 of FIG. 13), each angled post 58 with rubber bumper 59 becomes bias inward by the top cover cams 60 on interior walls 56a, causing bumpers 59 to move inward contacting edges E of wafers W, causing a slight compression of bumpers 59 against wafer edges E reducing or eliminating forces that create motion on the "X-Y" axis or "side to side motion" of the wafers W during shipping, reducing or eliminating surface damage such as "scratches".

FIGS. 17-21 show even another embodiment of the invention which provides the most economic method for restricting the motion of a wafer in the X-Y axis during shipping of the wafers. FIG. 17 shows the enclosed container 62 with a top cover 63 and a bottom cover 64.

FIG. 18 shows an isometric view of the bottom cover 64 with a plurality of angled post 65, whereas each post 65 has a cam 65a, flexible face 65b. Whereas face 65b is resilient and engages the edge of a packaged wafer.

Figure 20:
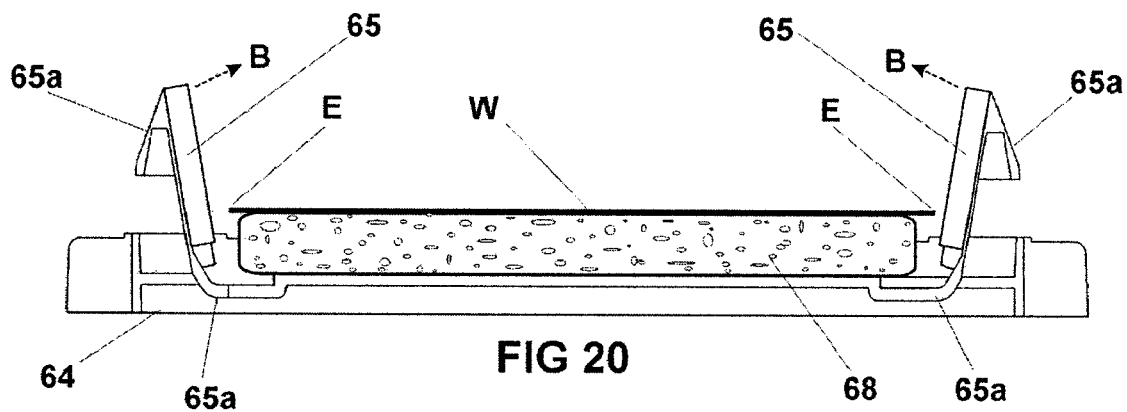
FIG. 20 is across sectional view taken through section 5-5 of FIG. 18.

In FIG. 20, wafer W resides on cushion 68 placed on the inside bottom of bottom cover 64. Angled posts 65 tilt outward so as not to interfere with the placement of wafer W on cushion 68.

Figure 21:
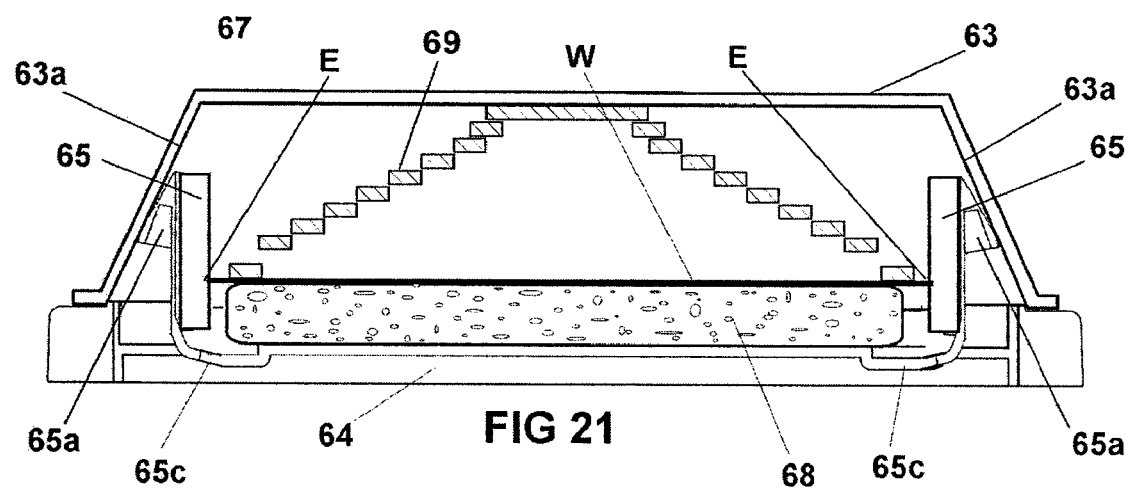
FIG. 21 is a cross sectional view taken through section 5a-5a of FIG. 17.

FIG. 21 shows a cross-sectional view taken along the section line of 5-5 of FIG. 17 with top cover 63 attached to bottom cover 64. When top cover 63 is placed on bottom cover 64, the inside wall 66 of top cover 63 moves against cams 65a, moving angled posts 65 inward to engage with the edge E of wafer W. Compression spring 67 holds wafer W against cushion 68.

FIGS. 22-27 illustrated an advance packaging system for safely packing one or more wafers. When more than one wafer are to be packaged, then special separators are used between wafers as described below.

Figure 22:
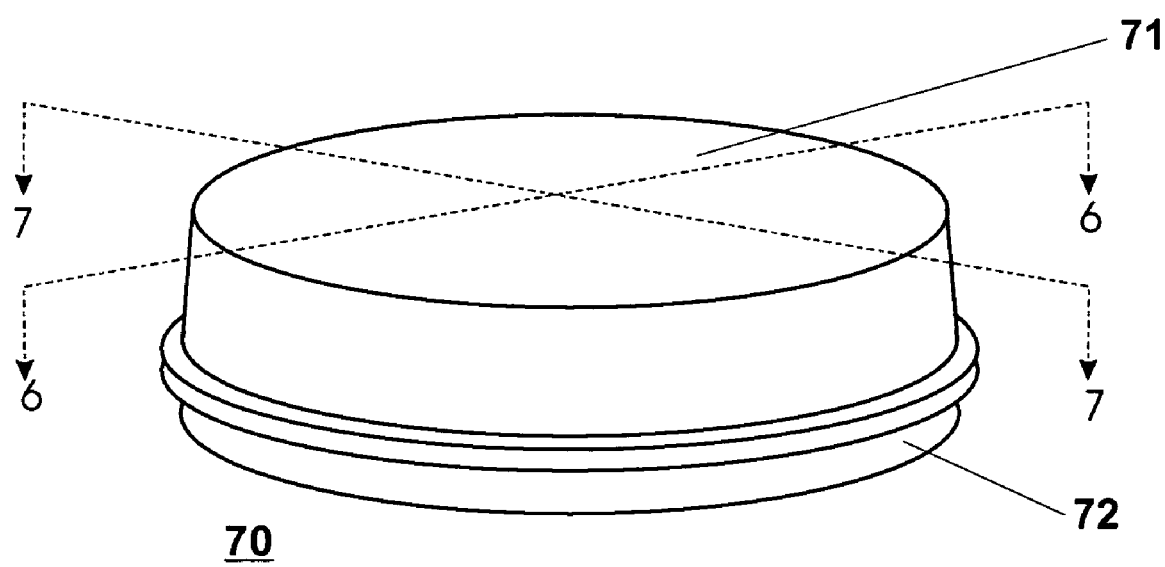
FIG. 22 is an isometric view of another embodiment of the invention.
Figure 24:
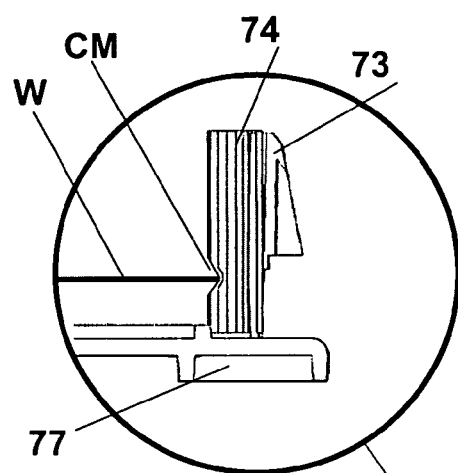
FIG. 24 is a detailed view showing the securing the edge of the wafer edge.
Figure 23:
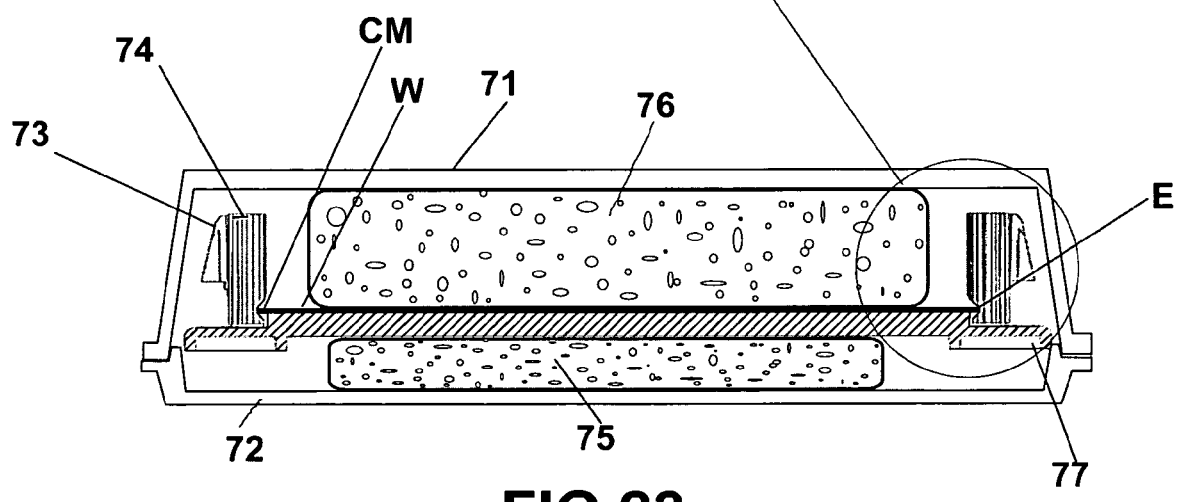
FIG. 23 is a cross-sectional view taken through 6-6 of FIG. 22.

FIG. 22 shows the basic enclosed container 70 having a top cover 71 and a bottom cover 72 having an assembly (not shown). A cross-sectional view taken through section 7-7 of FIG. 22 is shown in FIG. 23. FIG. 23 shows a single wafer. This packaging system at this point is essentially the same as the system illustrated in FIG. 4. A wafer is mounted in bottom cover 72 on cushion 75 and held in place by several vertical post assembly 73. Each vertical assembly 73 includes a rubber bumper and a cam 73a. Another cushion 76 is placed on top of wafer W. When top cover 71 is lowered over bottom cover 72, vertical post assemblies 73, shown in FIG. 24, are moved inward toward wafer W when the inside wall engages cams 73a, moving rubber bumpers 74 to engage the edge E of wafer W. Vertical motion is prevented by the compression of cushions 75 and 76 on each side of wafer W. Horizontal motion is prevent by the engagement of rubber bumpers 74 with the edge E of wafer W.

Figure 25:
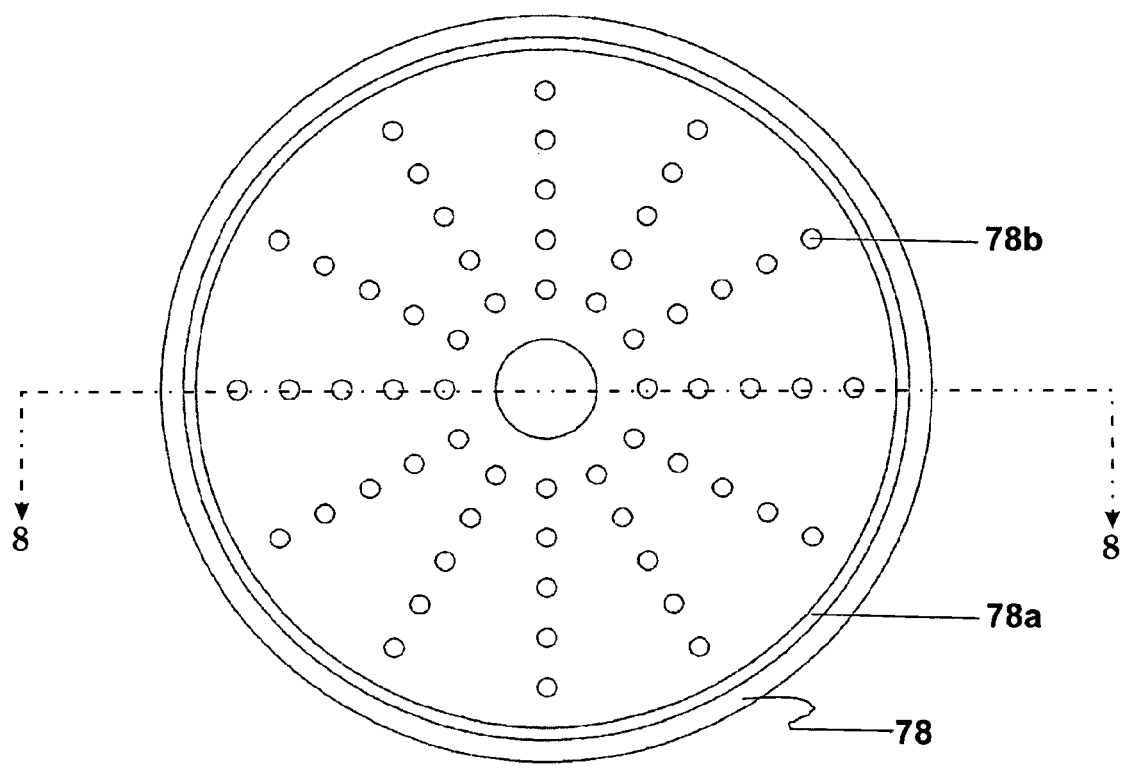
FIG. 25 is a top view of a separator used between wafers.
Figure 26:
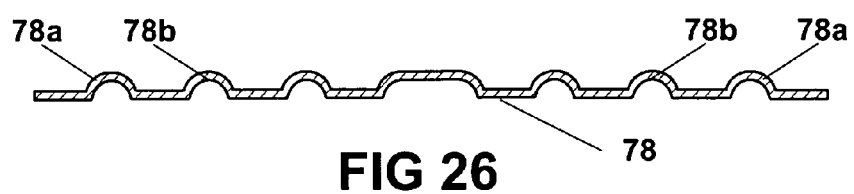
FIG. 26 is a cross-sectional view taken through section 8-8 of FIG. 25.

FIG. 25 is a top view of a special separator pad 78. Separator pad has a circular outer embossment 78a associated with multiple stand alone individual embossments 78b. A cross-section view of pad 78, taken along section line 8-8, is illustrated in FIG. 26. The embossments (78a and 78b) depths are adjustable in accordance with thickness of wafers being packaged. Separator 78 has the combined purpose to provide: (1) An electrical path to earth ground in the case of an ESD event within any surface area of packaged wafer; (2) Cushion wafers while being transported from one location to another location; and (3) A clearance that equals the height of the next packaged wafer having elevated members, such as bond pads and caps, that becomes the means to friction that would otherwise cause surface damage during shipment phases.

Figure 27:
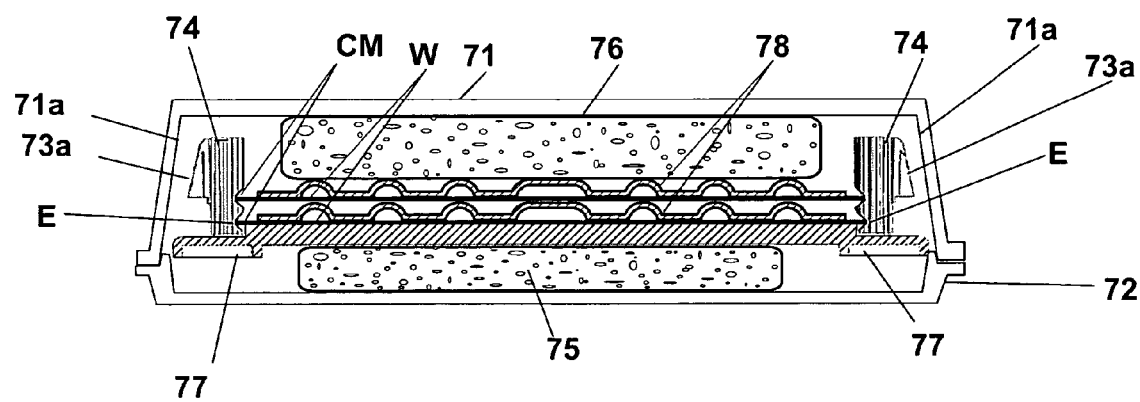
FIG. 27 is a cross section view taken through section 7-7 of FIG. 22 showing multiple wafers.

FIG. 27 is a cross-sectional view taken along the line 7-7 (FIG. 22) that shows that wafers W are alternately packaged with special separators 78. Edges E of wafers W are firmly held in place by the compression being applied against multiple rubber bumpers or cushions 74 when biased inward when top cover 71 is assembled to bottom cover 72. Vertical motion of wafers W is prevented by the cushions 75 and 76.

The packaging system illustrated in FIGS. 22-27 controls wafer motion on the X, Y and Z Axis with the additional features: to cushion the packaged wafers to avoid breakage; provide a resiliency means to avoid damage to edges of said packaged wafers; provide a separator with means to avoid friction on said packaged wafers having elevated members such as bond pads; and provide a means for electrical paths to earth ground to avoid ESD events. This embodiment is superior to boxes with vertical members having no resiliency, and separators with a center hole which have no means to physically support center areas of packaged wafer.

Present-day boxes/containers designed for packaging and shipping IC wafers from one location to another location lack means by which to secure the top cover to the bottom cover that could possibly cause a loss in wafers. Present day wafer shipping boxes in general only have "snap-fit" arrangements which include a catch and latch arrangement by which to secure the top cover to the bottom cover. The top cover is normally the "catch" and the bottom cover is normally the "latch" and the combination becomes a means to "snap-fit" top and bottom cover to each other by which to achieve a degree of wafer security during shipment phases.

Another shipping box on the market has a top and a bottom cover with a "screw-on" arrangement by which to achieve security. There is a jar that has a top cover that simply "snap-fits" to the bottom cover by which to achieve security for wafers packaged therein. In all cases, none of these designed containers feature a method by which to provide a secondary means to provide a positive locking method so as to assure that top and bottom cover become secure to each other in the case of situation causing and accidentally opening resulting in a catastrophic loss of wafer content.

There are problems associated with all of these type-shipping boxes. For example, there are wafer shipping boxes which have a latch and catch arrangement that are normally mounted on the outside of bottom cover. This type of latch will not support "over-packaging" that causes the structure of the box to become stressed and therefore results in an uneven platform for packaged wafers. This unevenness caused by an "over-packaged" box will subject packaged wafers to breakage during shipping phases. In the case of the "screw-on" type box, the clock-wise and counter clock-wise turning of the top cover will transfer twisting motion to top packaged wafers to cause scratch damage. In the instance of the jar concept, the security of packaged wafers only extends to tension assigned to the top lid that fits the bottom cover.

Figure 28:
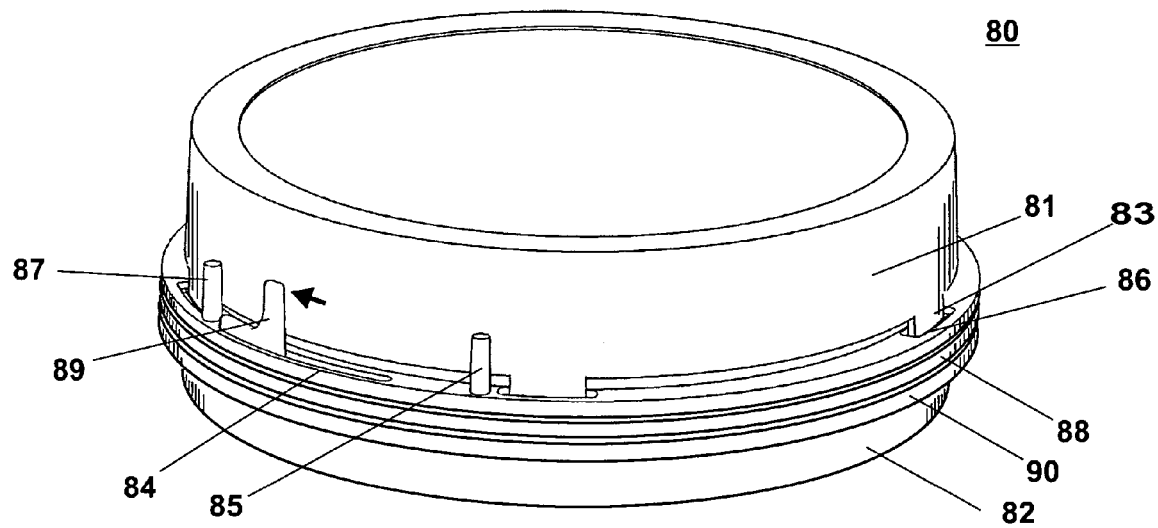
FIG. 28 is an isometric view of an embodiment having a locking top, shown in the locked position.
Figure 29:
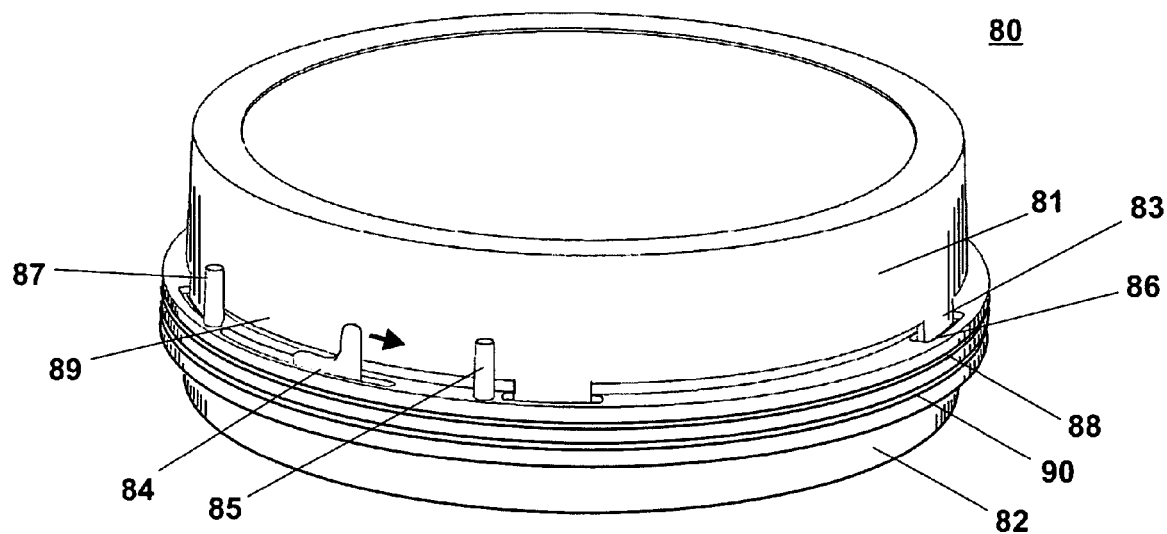
FIG. 29 is an isometric view of the embodiment of FIG. 28, showing the top in the unlocked position.
Figure 30:
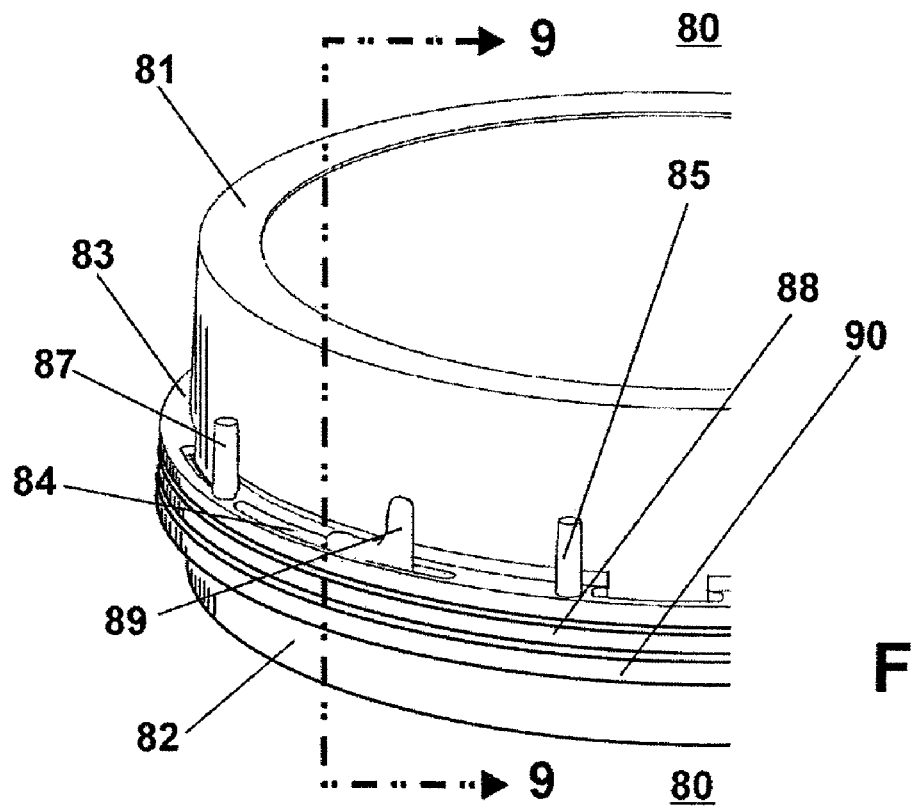
FIG. 30 is a partial isometric view of the embodiment of FIG. 28 showing details of the locking members.

FIGS. 28-33 illustrate a first embodiment of a box/container method by which top and bottom covers of WEC Boxes can be secured to each other by positive means. Box 80 includes a top cover 81 and a bottom assembly 82. FIG. 28 shows box/container 80 in a latched condition and FIG. 29 shows box/container 80 in an unlatched condition. Box/Container 80 has a locking ring 88 assembled to bottom cover 82. Locking ring 88 is held in place by a retainer ring 90 and ring 90 has a vertical moveable member 89 that has the purpose to actuate ring 90 and whereby vertical member 89 is received within an elongated slot 84 that associates with flange 83 that is an integral part of top cover 81. This arrangement provides means to lock and un-lock top cover 81 from bottom cover 82. A simply hand motion can be applied to manipulate said locking ring 88 in the lock position by a simple hand motion using the index finger and thumb between fixed vertical member 87 and moveable vertical member 89. A reverse movement is used for the un-locking the box/container.

Figure 31:
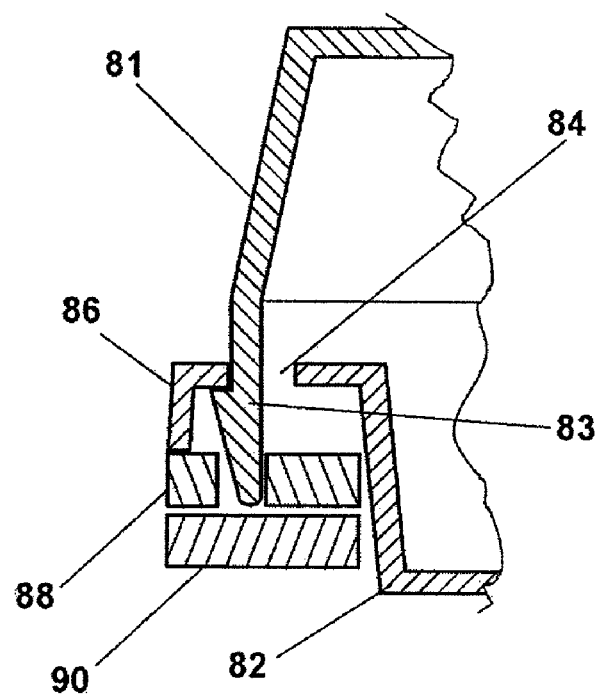
FIG. 31 is a cross-sectional view taken through section 9-9 of FIG. 30.
Figure 32A:
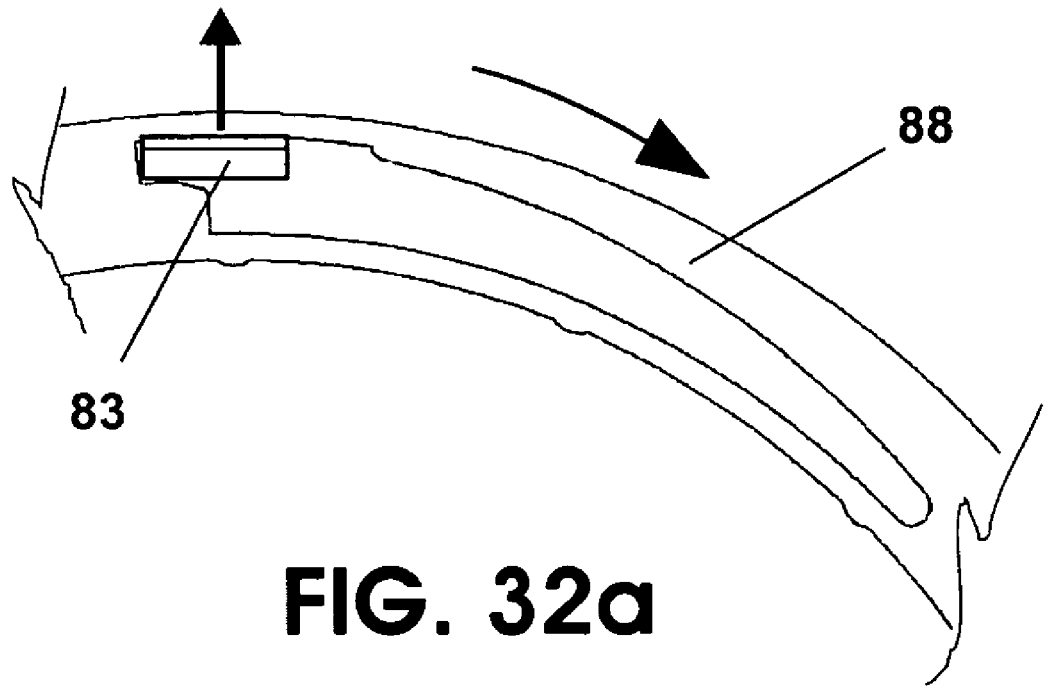
FIG. 32a shows the lock of FIGS. 29-32 in the locking position.
Figure 32B:
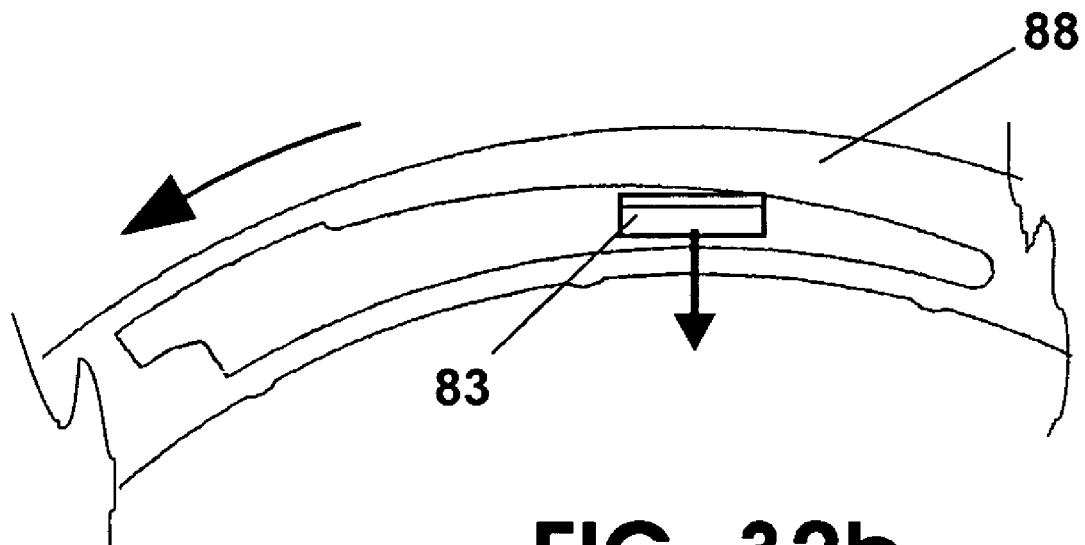
FIG. 32b shows the of FIGS. 29-32 lock in the un-locked position.

FIG. 30 through FIG. 32b shows the locking mechanism and the means by which top and bottom covers become secured to each other. The function of the lock/unlock concept provided by locking ring 88 is illustrated starting with a cross-sectional view of FIG. 31 taken along the line 9-9 of partial view FIG. 30. FIG. 31 shows top and bottom covers, 81 and 82 respectively, secured to each other by a latch 83 and catch 86 arrangement, whereas 83 is an integral part of top cover 81 and whereas the catch 86 is an integral part of bottom cover 82. Locking ring 88 has slotted areas 86 which moves latch 83 in either locked or un-locked position as illustrated in FIGS. 32a and 32b, respectively, causing the relationship to change between the top cover 81 being secured to bottom cover 82 or not secured as demonstrated in cross-sectional views A, B, C and D shown in FIG. 33.

Figure 33A:
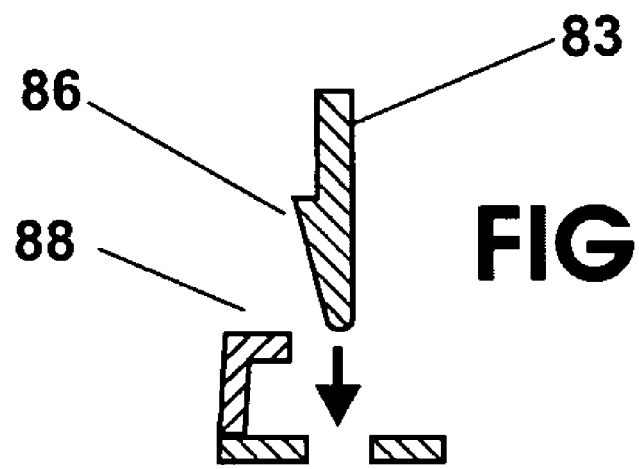
FIG. 33 (A-D) show the positions of the locking members.
Figure 33B:
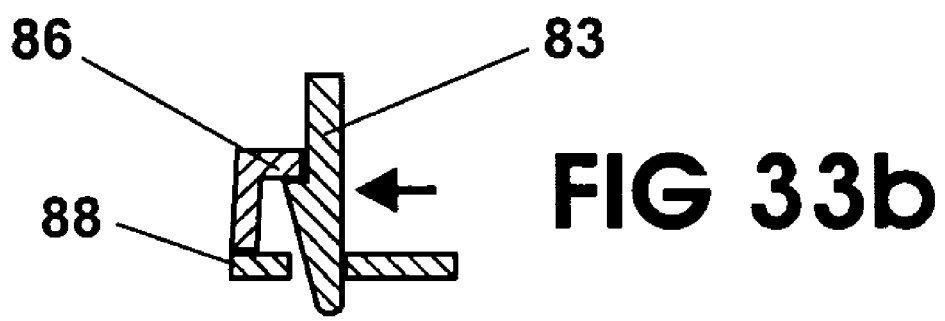
Figure 33C:
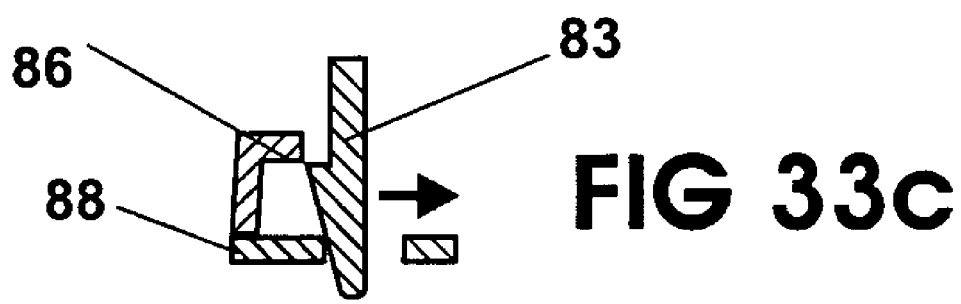
Figure 33D:
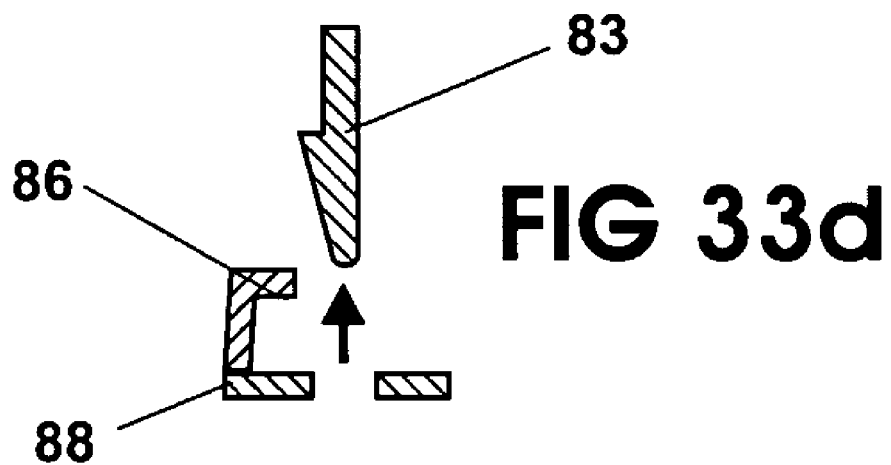

In FIGS. 33a-33d, Latch 83 of top 82 is moved downward into slot X, and then latch 83 is moved in to the locking position as illustrated in FIG. 33b. When top cover 81 is to be removed, latch 83 is moved to the unlocked position, FIG. 32b, released as shown in FIG. 33c and moved upward as shown in FIG. 33d. When top cover 81 is latched to bottom cover 82, the packaged wafers may be safely transferred from one location to another location.

Figure 34:
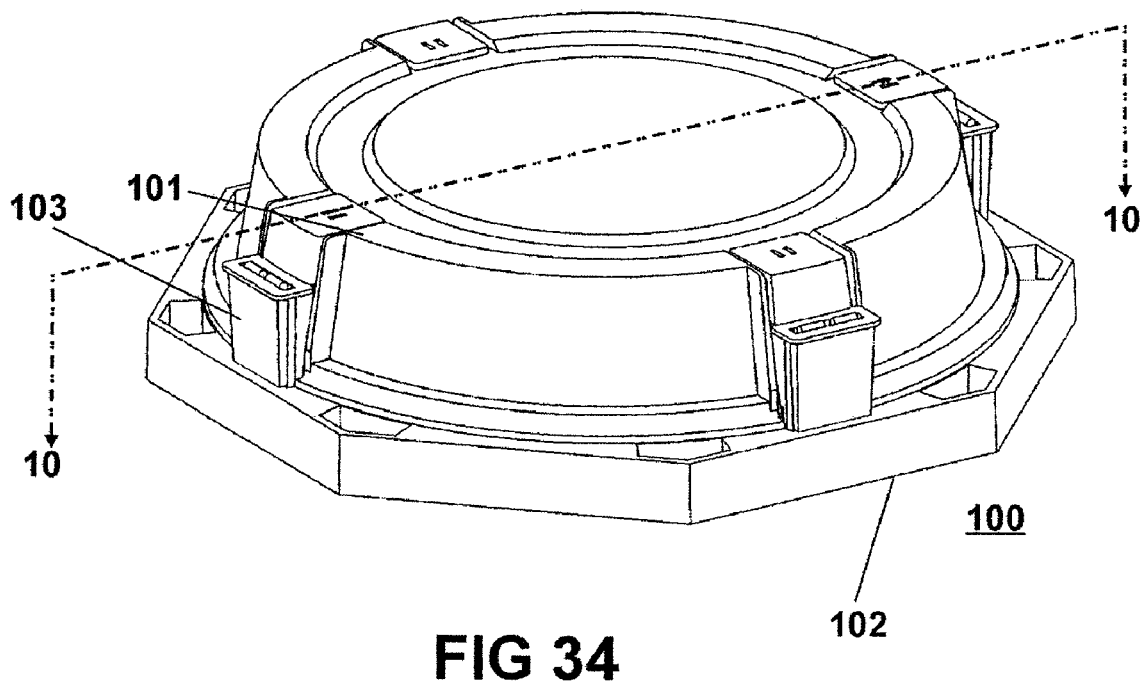
FIG. 34 is an isometric view of another embodiment of a secure locking container.
Figure 35:
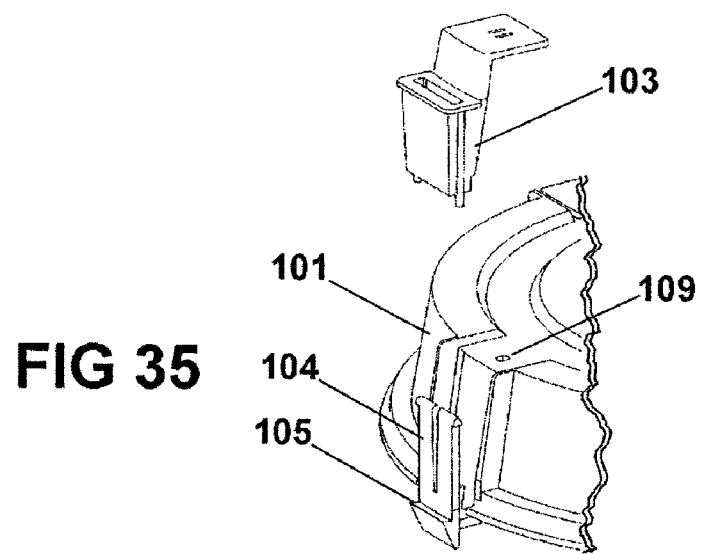
FIG. 35 is a partial view of the locking mechanism of the container of FIG. 34.
Figure 36:
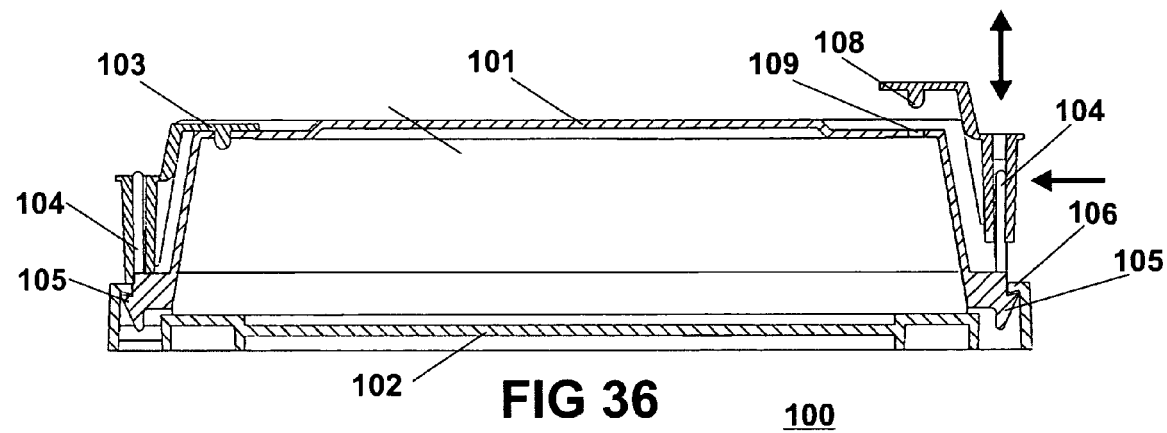
FIG. 36 is a cross-sectional view of the container of FIG. 34, taken through section 10-10.
Figure 37:
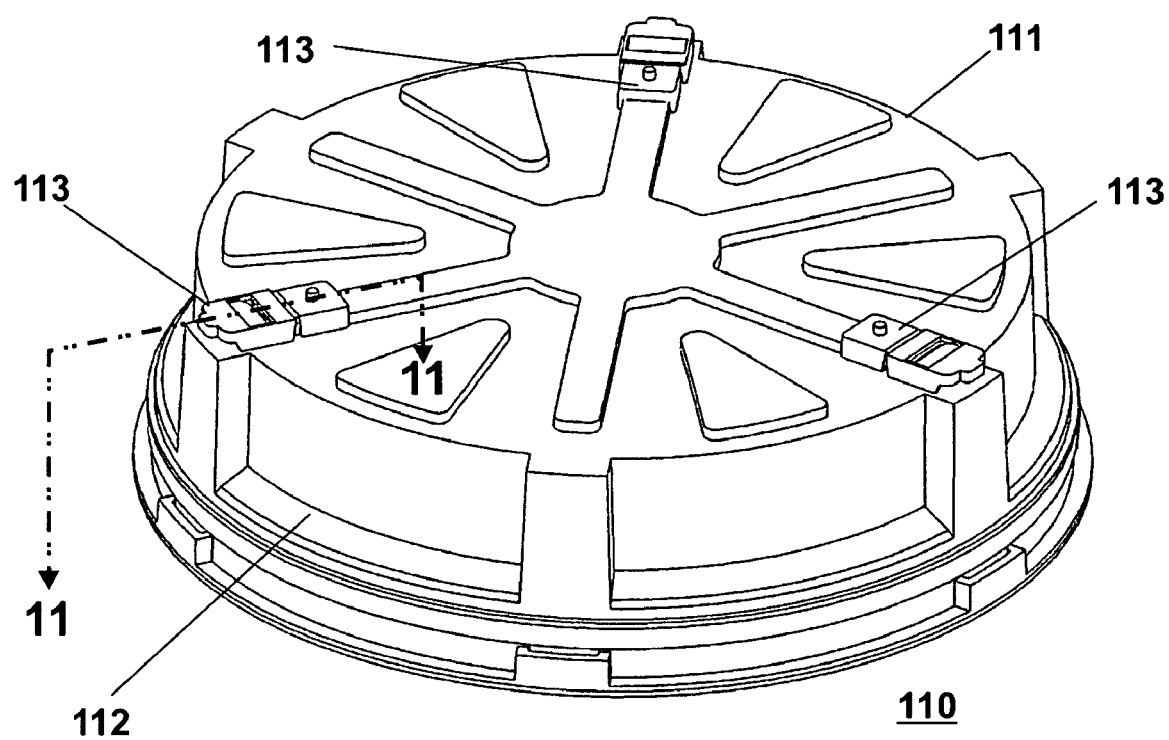
FIG. 37 shows an isometric illustration of another embodiment of a secure wafer container.

FIGS. 34-36 illustrate another latching method for securing the top cover to the bottom cover of the wafer packaging system. FIG. 34 shows a packaging box/container 100 similar to previously described boxes/containers in as much there is a top cover 101 and a bottom cover 102. Box 100 has an actuator 103 that becomes moveable in the down or up position by which to lock or unlock the top cover 101 from the bottom cover 102 hereinafter referred to as catch/latch means. FIGS. 35 and 36 (cross-section through 10-10, FIG. 34) illustrate that each actuator 103 is assembled to bottom cover 102 by means of latches 103. Latch 103 is moved downward over latch part 104 which is an integral part of top cover 101. When top cover 101 is placed over an moved downward over bottom cover 102, latch part 105 "snaps" under edge 106 of bottom cover 102. Latch 103 is them place over latch part 104 an moved downward, with projection 108 snapping in to opening 109 in top cover 101. This prevents the movement of latch part 104 and the releasing of the top cover 101 from bottom cover 102. To remove the top cover 101 from bottom cover 102, latch 103 is moved upward and the tilted outward to flex latch part 105 from under edge 106 of bottom cover 102, releasing top cover 101 from bottom cover 102.

The across-section view FIG. 36 shows latch 103 in a downward latched position (on the left), and in an upward position (on the right).

FIGS. 37-40 illustrate a shipping box/container 110_in which the top cover 111 has multiple hingeable latches 113 designed to secure the bottom cover 112 to top cover 111. The bottom cover 112 has multiple vertical members 114 that circumferential align to top holes 115 and whereas each said member 114 has a catch 116 and whereas said catch is designed in a manner so as to "snap-fit" into place on said top cover as shown in cross-sectional view FIG. 38 taken along the line 11-11 and whereas said catch 116 is held into place by said latch 113 thereby securing said top cover to said bottom cover. Whereas said top cover 111 is removable by a simple hand procedure of lifting the hingeable latch 113 shown in cross-sectional view FIG. 39 by which procedure overcomes front side under-cut 117 that is an integral part of catch 116. Whereby another simple hand shown in FIG. 40, will totally disengage top cover by forcing said catch 116 away from the center of said Box/container 110 by which action clears the front side under-cut 117 of catch 116 while simultaneously clearing top cover alignment holes 115 and thus providing means for removing top cover 111 from bottom cover 112 as illustrated in FIG. 40.

FIG. 41, FIG. 42 and FIG. 42a illustrate a packaging box/container for limiting or preventing motion of a wafer in the box/container. Box/container 120 shown in FIG. 41, has a top cover 121 and bottom cover 122.

FIG. 42 is a cross-sectional view taken alone the lines 12-12 that shows bottom cover 122 has a floater plate 129 that is supported by a cushion 123. Floater plate 129 has multiple vertical members 126 holding rubber bumpers 125 which contact edges E of wafer W. Wafer(s) packaged in box/container 120 become sandwiched between top cushion 128, a component part of top cover 121, and bottom cushion 123 is under floater plate 129.

FIG. 42a is a partial view showing wafer on floater plate 129, with vertical member 126 holding rubber bumper 125 against wafer W. The compression CM prevents the lateral motion of wafer W.

Figure 43:
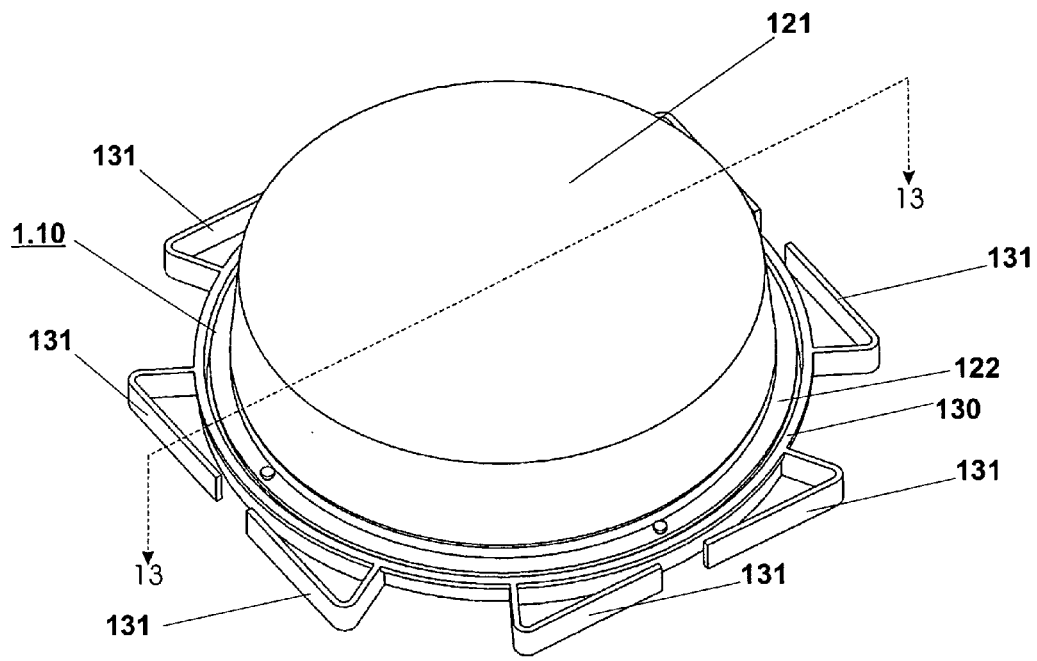
FIG. 43 is a wafer box similar to that of FIG. 41 including a floater adaptor; 43.
Figure 44:
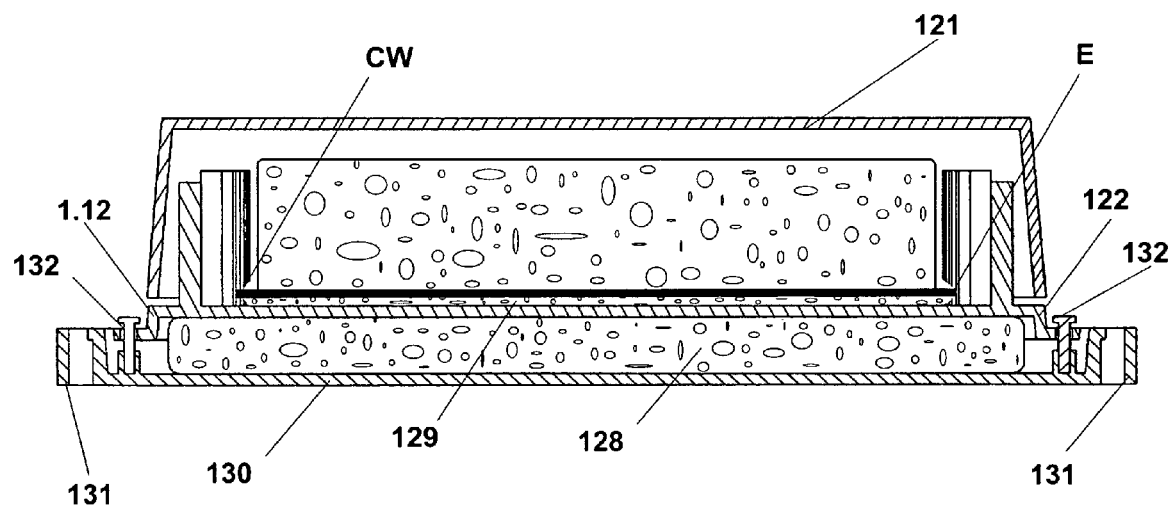
FIG. 44 is a cross-sectional view of FIG. 43 box/container to absorb airborne molecular contaminants.

Whereas FIG. 43 is basically the same box/container as in FIG. 41 with the exception there is provides a floater adapter 132 that provide for more an isolation feature as illustrated in cross sectional view shown in FIG. 44 that is taken alone the lines of 13-13. Whereas adapter 130 has several extending polymer bumpers 131 that are peripheral to outer side of the box/container and absorb any shock energy in the event of mishandling such as an accidental drop from a work a work or process bench. NOW, whereby this arrangement provides total isolation from shock energy that might occur due to WEC Box/container mishandling during shipment phases. Top cushion 129 is designed to automatically accept 1 to 25 wafers measuring in thickness from 5 to 32 mil with necessary resiliency to absorb any damaging shock energy that is being transferred from top and bottom cover box/container housing that travels alone the Z-Axis in the direction of packaged substrates. Rubber bumpers 125, that are in contact with wafer edges, serve as isolators to absorb any shock energy that travels in the direction of said wafers on the X-Y Axis from the Box/container housing.

Figure 48:
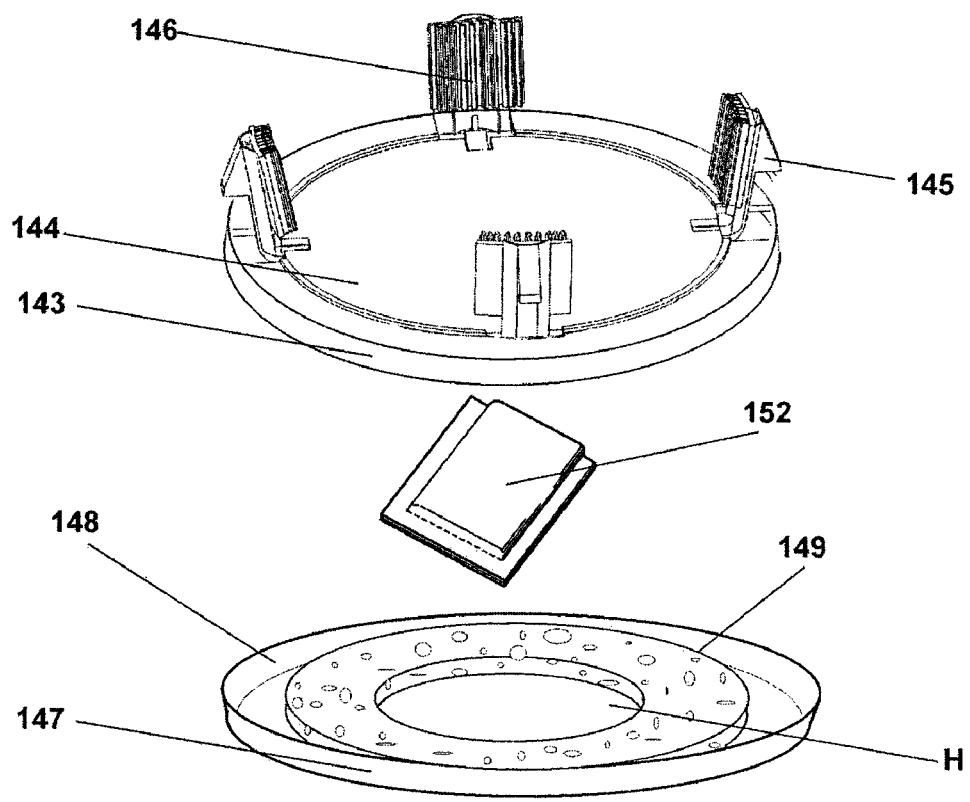

FIGS. 45-49 illustrate wafer shipping boxes/containers designed to absorb or abate airborne molecular contaminants within the shipping box/container. A floater plate 143, used in previous designs, is used in this design and is shown in FIG. 48. FIG. 45 shows the shipping box/container 140 with top cover 141 and bottom cover 142.

FIGS. 46a and 46b show a breakable vial 150 that has the ability to hold a granular material 151 designed to absorb AMCs. FIG. 46b is a cross-section view (taken alone the line of 14a-14a) of vial 150 showing the granular material 151. Vials 150 are made of thin wall glass and are easily breakable, and are placed within the open-end 153 porous bag 152, as shown in FIG. 47a, then bag 152 is sealed closed a shown in FIG. 47b. Bag 152, hereinafter referred to as the Absorber Package 152, has a first primary purpose to receive and capture ionic corrosive gasses or AMCs trapped within the wafer shipping boxes through its porous walls, and has a secondary purpose to retain both glass pieces and granular material 151 when the glass vials are broken.

FIG. 48 shows a bottom cover 147 with a compressible cushion 149. Cushion 149 has an opening H in it center in which one or more sealed absorber package 152 are placed. Floater plate 143 with is placed in bottom cover 147 around cushion 149.

Floater plate 143 is moveable and becomes the means by which downward pressure, when it is placed in bottom cover 147, can be applied either by manual or automatic means to break vials 150 within Absorber Package 150. When vials 150 are broken, absorber material 151 absorbs corrosive gasses that are associate with wafers packaged within enclosures such as a box/container.

Figure 49:
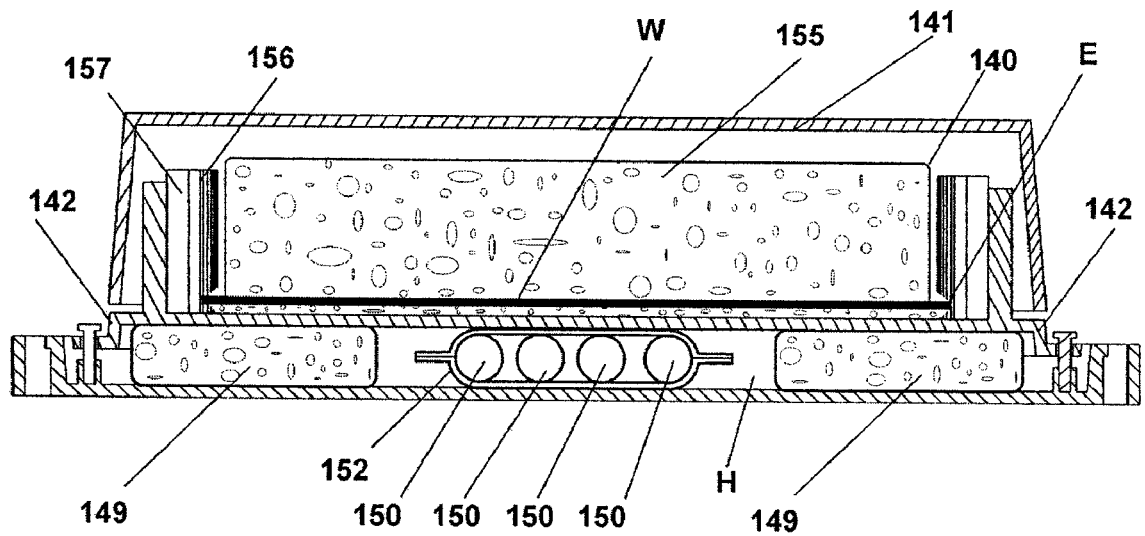

FIG. 49 shows the closed shipping package with floater plate 142 over cushion 149 and absorber package 150. Wafer W is held in place by cushion 155 and rubber bumper 156 on vertical members 157. Top cover 141 encloses and seals the wafer(s) W within the shipping box/container 140.

Figure 50:
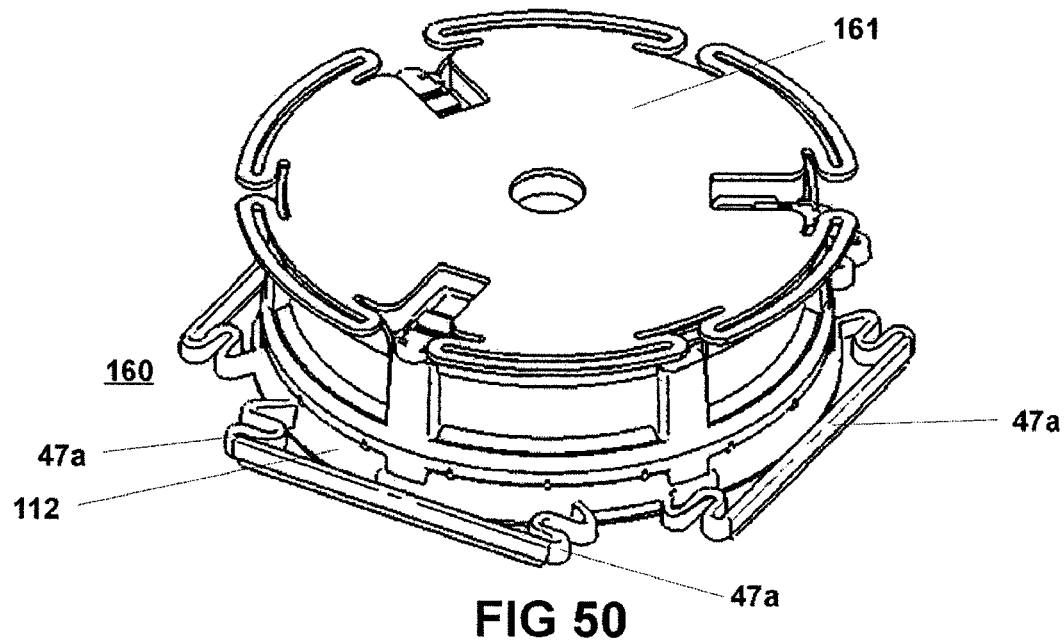
FIGS. 50 and 51 illustrate a shipping box with a device to absorb shock energy.
Figure 51:
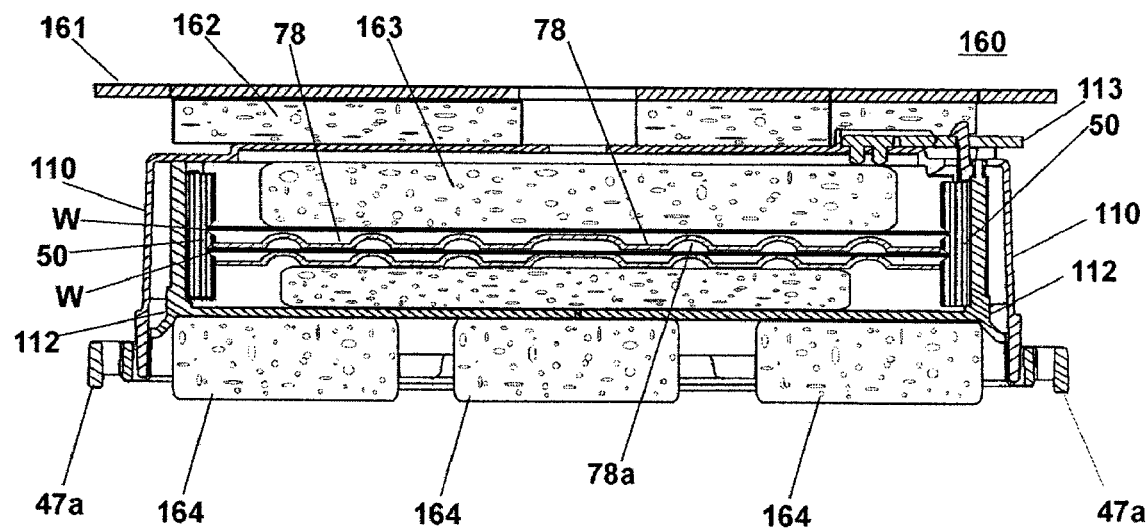

FIGS. 50 and 51 illustrate a shipping box/container having a special method to absorb shock energy caused by poor handling procedures.

Fragile Wafers, packaged within boxes/containers, can easily receive shock energy in any and all directions. These thin fragile wafers within shipping boxes must have means to absorb shock energy on every possible axes that would otherwise transfer at any point to damage the fragile thin substrate. Cushions packaged within enclosures will normally be inefficient if the box/container is accidentally dropped from a height of 30" or more. Therefore, those that have packaging and shipping responsibilities must depend on other means by which to absorb excess shock energy. Thus, the method that is now prominently used is that the container holding wafers are packaged within cardboard box having foam strategically placed on the inside by which to absorb excess energy during shipment phases. The issues of breakages must include the time that wafers are packaged and being handled prior to shipment phases as compared to packaged wafers within cardboard boxes having added packaging by which to provide extra protection against shock energy. Except for external cushion arrangements, the Box Assembly 160, shown in FIG. 50-51, is designed to protect fragile wafers from breakage during drop tests of 30", has much the same design and features described and shown in FIG. 11, FIG. 25-27 and FIG. 37-40. Where the parts of the box/container assembly are the same as the prior configuration, the same numbers have been used for same parts. FIG. 9-12 show a top and bottom cover, 46 and 47 respectively, whereby bottom cover 47 has multiple rubber bumpers 50 shown in FIG. 11 becomes biased by top cover 46 interior wall cams 48 so as to flex or move inward causing intimate compression C that provides a means of "resiliency" to reduce or eliminate "shock energy" caused by mishandling such as an accidental drop and/or provides a means of "resiliency" to reduce or eliminate "forces" that create motion on the "X-Y" axis surface of wafers that causes damage such as "scratches". FIG. 25-27 shows a Cushioned Bump Leafs or separators 78 having multiple stand alone individual embossments taken either shape and/or both shapes demonstrated in design 78a and 78b shown in cross sectional view FIG. 26. The separators 78 are alternately placed between each wafer shown in cross-sectional view of FIG. 27 which provides a means of "resiliency" between packaged wafers. The "resiliency" that absorbs "shock energy" traveling in the direction of the fragile packaged wafers, is a product of air trapped within each and every stand alone embossments of 78a and 78b. Embossments 78a and 78b are exceptional unique in performance in that the trapped air will expand plastic embossments to become "shock absorbers" when any g-force creates "shock energy" that transfers in the direction of wafer W substrate to cause breakage. This would be particular true if said "shock energy" was created alone the lines of y-axes. Whereas FIG. 37-40 shows a latch and catch arrangement, 114, 116 and 117 respectively and said arrangement is firmly and positively held in place by locking means 113. Wafers W are packaged within a WEC Box_shown in FIG. 50-51 with alternating Cushion Bump Leafs 78 having "resiliency" that has the function to absorb energy on the Y-Axis, and wafers W are compressed C between multiple rubber bumpers 50 having "resiliency" and the box/container bottom cover 112 has built in multiple side bumpers 47a having "resiliency" by which to absorb internal shock energy. Box/Container assembly 160 has a top absorption plate 161 that is independent of top cover 110 that communicates with a foam pad 162 with "resiliency" and whereas bottom cover 112 has multiple stand along foam cushion pads 164 collectively having resiliency and whereas said wafers W are securely packaged between a top and bottom High Energy Absorbing (HEA) Cushions, 162 and 164 respectively.

Moisture vapors are an extreme critical issue for IC wafer, particular for wafers having faster speed, smaller geometries, thinner substrates and alloyed with copper. The problem lies in the fact, that if not removed from enclosures of bags and boxes/containers holding packaged wafers, they become conveyors to mobilize any presence of excessive AMCs to move in the direction of bond pads to cause corrosive damage.

Water vapors molecules that are polarized with unsymmetrical distribution of charges will causes a firm attachment or "sticking" to interior surfaces of boxes and bags enclosures holding packaged wafers to cause corrosive damage during shipment phases. Vapors are catalysis for AMCs, and, if not satisfactorily removed from said enclosures, will become corrosive residues by which to corrode bond pads during shipment phases.

The present day method for removing or reducing moisture vapors from surfaces enclosures of bags and boxes/containers holding packaged wafers is by methods having vacuum means. The problem with this concept is that air movement caused by said vacuum means would do little or nothing in neutralizing the charges of vapors that maximizes removal. The amount of vapors removed will only equal the amount vacuum applied. The prominent means by which to remove any remaining vapors that stick to enclosure interior wall is by using getters or desiccants that have water absorption capability. The required amount of desiccant measured in units will equal the desired dryness measured in RH, the MVTR assigned to the bag enclosure, the area of bag enclosure and the desired time by which to achieve said dryness. The problem that associates with desiccants can be found in the fact that they absorb corrosive residues made of AMCs that are extremely small in size, corrosive residues, have charges and remain in motion and provide a corrosive background for packaged wafers.

The better solution is to use a nitrogen source to "strip" moisture vapors from the walls of enclosures and the surfaces of wafers. Whereas nitrogen ($N_2$), having no polarization of charges, will remove moisture vapors when the nitrogen collides with moisture vapors having polarization with unsymmetrical distribution of charges. This then becomes an enhanced method by which to remove vapor molecules from enclosures of bags and boxes/containers holding packaged wafers.

Figure 52:
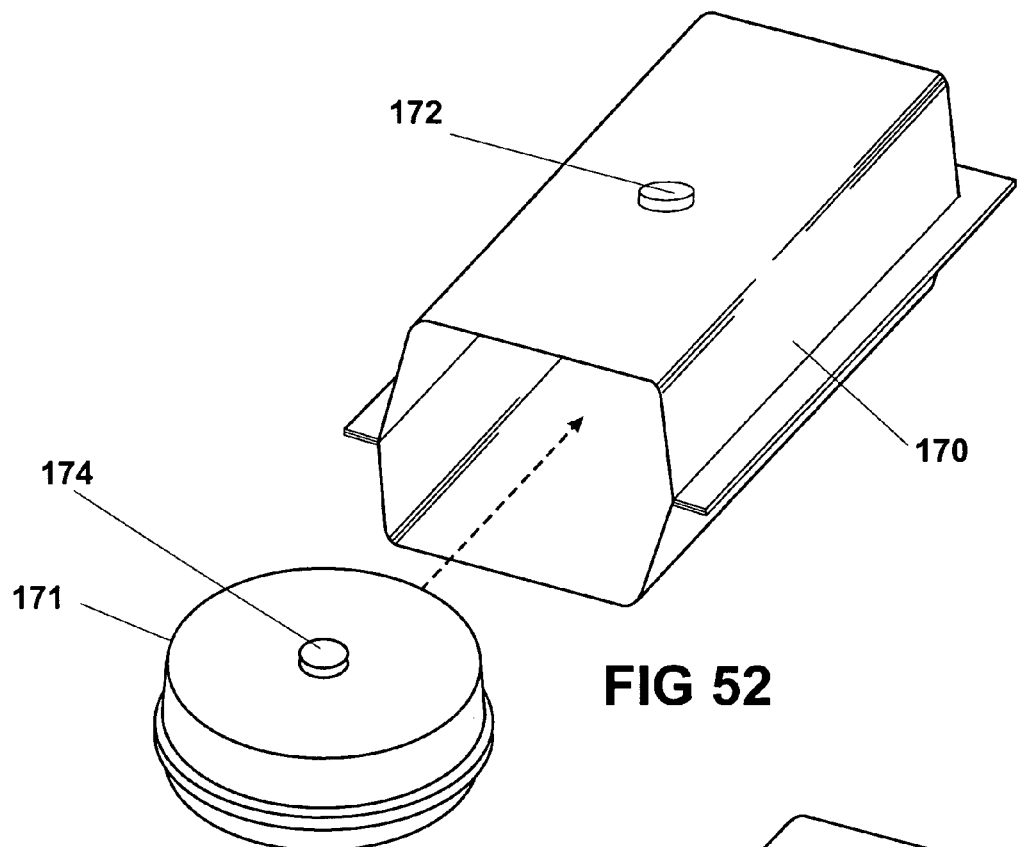
FIGS. 52-54 show the use of a moisture vapor bag for holding wafer boxes.
Figure 53:
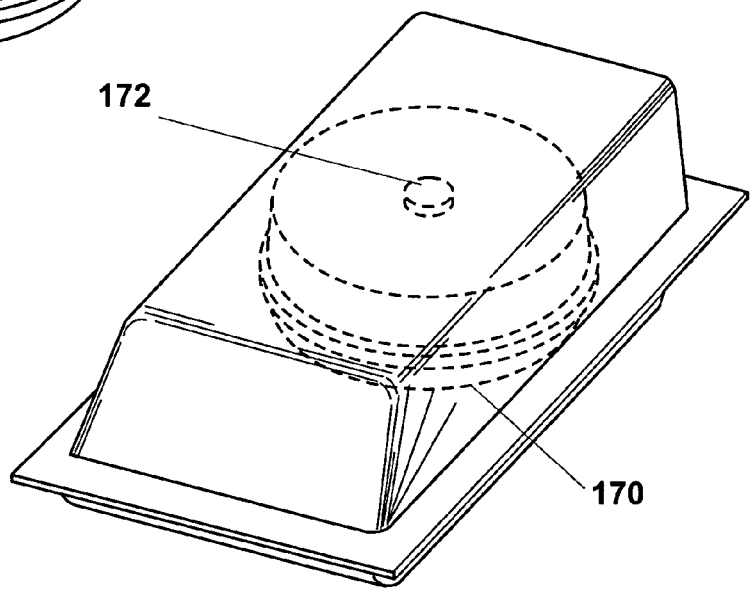

FIG. 52 shows a moisture barrier bag 170 having a MVTR if at least 0.02 that is prepared to receive shipping box/container 171 and whereas said bag 170 has a bag septum 172 that is female and the said box/container has a male septum 174. The bag septum 172 and male septum 174 can be matched when box/container 171 is placed and sealed in bag 170, as shown in FIG. 53.

Figure 54:
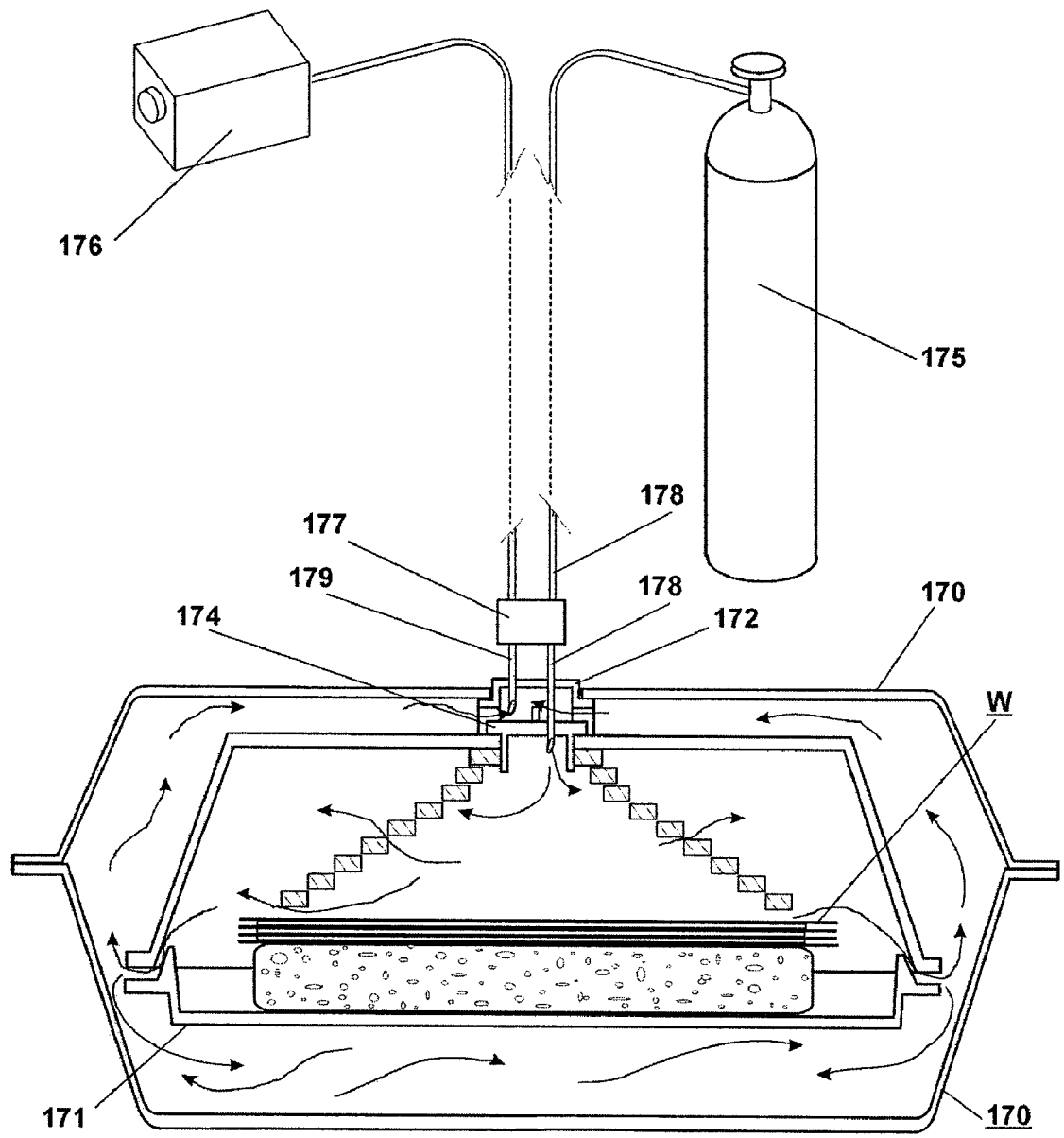

FIG. 54 is a cross section view showing the enclosed wafer package and the system whereby moisture vapors are "stripped" from walls of enclosures using a nitrogen source 175 and a vacuum source 176 which both communicate with a probe 177 having hollow needles, 178 and 179 respectively. Needle 178 communicates directly with nitrogen source 175 and needle 179 communicates directly with vacuum source 176. Needle 178 passes directly through bag septum 172 into box/container male septum 174, and needle 179 passes only through bag septum 172. When nitrogen gas and a vacuum is applied simultaneously within the enclosures of both bag 170 and box/container 171, the pressure of the nitrogen goes directly to the box/container 171 and collides with moisture vapors "sticking" on interior surfaces. The applied nitrogen causes a drying action resulting in a "stripping" action of both container and bag by means of evacuation through bag septum 172.

Present day boxes/containers designed for wafer shipment are low cost and therefore are not refurbished and recycled for reuse. The problem with this practice is there short supply of land fills on a world wide bases. Fabrication companies that ship finished wafers to end customer give minor consideration to the problems associated with land-fills in regards to disposition of boxes/containers made of polymers. Even though there are regulations in place that specify recycle of plastic by re-grinding methods, this does not satisfy the demands of packaging of sensitive articles in the sense that it is an extended process using resins that no longer would be an engineered grade resulting in controlled levels of chemical. There are programs whereby fabrication companies specify shipping boxes/containers to be recycled for reuse and this presents a unique problem of certifying that the box/container polymer remains within acceptable use in term of ionic contamination.

In accordance with the concept of the CP System of the present Invention, all boxes/containers are designed in manner whereby all component part that are designed to address the issues of wafer motion, moisture vapors, breakage and/or AMCs are certifiable to remain with the Maximum AMC Limits establish to avoid the issues of ionic contamination. All wafer boxes/containers of the present invention are recycled and refurbished in accordance with the "Recycle & Refurbish Flow Chart" shown in FIG. 55.

Figure 55:
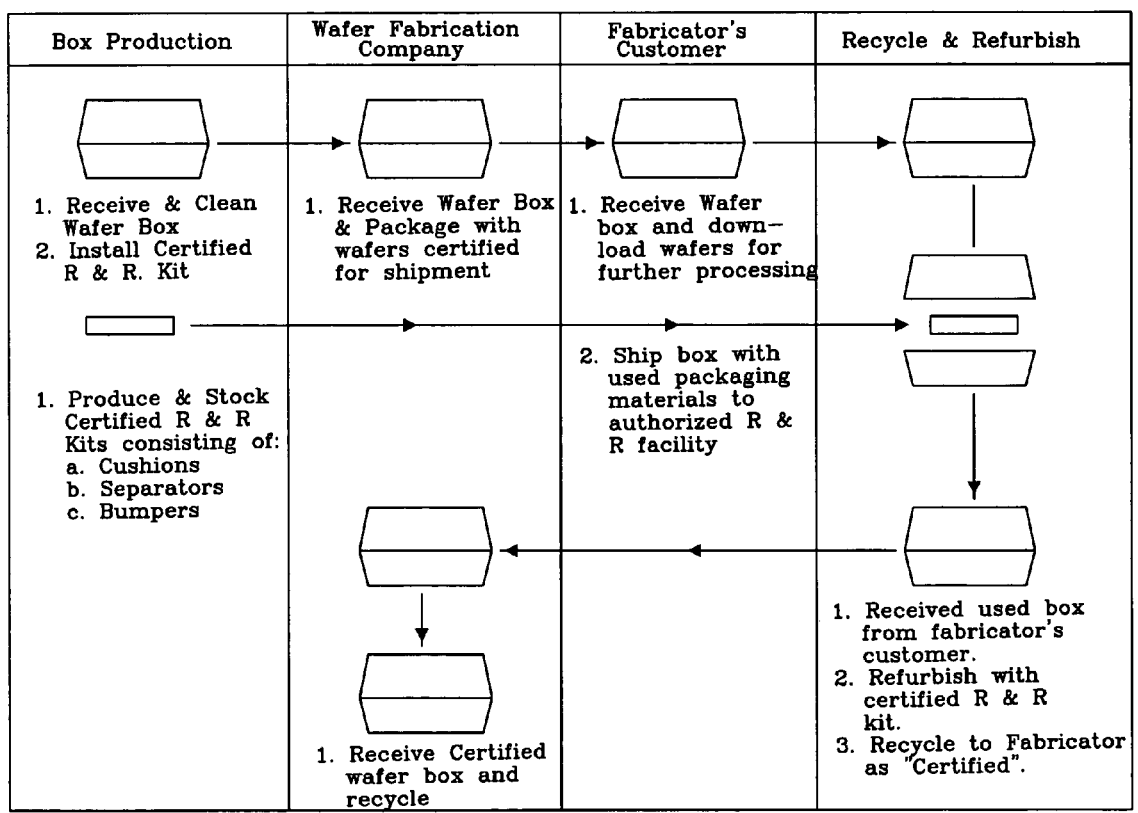
FIG. 55 is a Chart illustrating a Recycle and Refurbish Program for container reuse.

FIG. 55, in accordance with the Recycle and Refurbish Program, shows that WEC Boxes/Containers can be recycled and refurbished multiple times for the purpose or reducing cost and landfill impact. The Wafer fabrication company receives the wafer box/container and packages wafers certified for shipment. The Fabrication customer receives wafers and removes the wafers for further processing. The empty wafer boxes/containers are recycled cleaned and refurbished with certified component parts, which includes new cushions, separators and bumpers. The wafer box/container is certified and then shipped to the wafer fabrication company for reuse.

Figure 56:
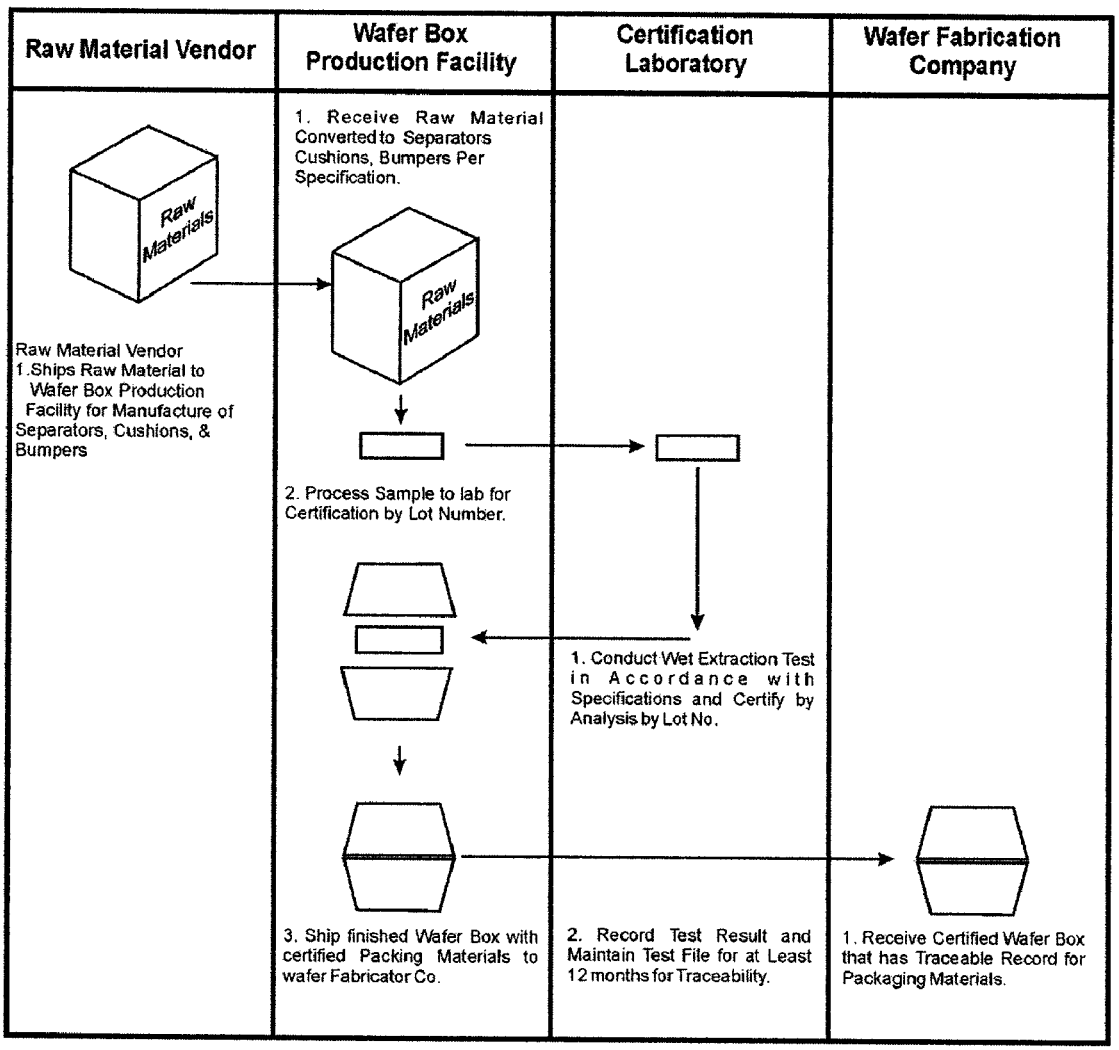
FIG. 56 is a Chart illustrating a Quality Assurance/Certification Program for containers and packaging components.

FIG. 56 shows a method and procedure, a Quality Assurance/Certification Program, for the production and certification of wafer shipping boxes/containers and packing material. Referring to FIG. 56, the packaging materials for wafer boxes/containers are shipped to production facility. The separators, cushions and bumpers are converted and then certified in a laboratory, which includes a wet extraction test. The packaging materials are certified by lot number and then shipped, along with a wafer box/container, to a wafer fabricator company which receives wafer boxes/containers and packaging material that has a traceable record.

Wafers being shipped in boxes/containers from one location to another location using present day methodology can and will elevate to a new level of corrosive damage that was added during the period of transportation. Any added levels of corrosive AMCs that occur during shipment phase can equate to the problem of wafers shipped not necessarily being in the same pristine condition fabricated. Excessive moisture vapors combined with excessive AMC's that become trapped within enclosures holding IC wafers is a formula for increased Cost of Ownership that generally is not well understood by those that manufacturer and fabricate IC Wafer. This is because there is a complacency in regards to a lack of understanding or appreciation for the concerns of: (1) Packaging materials that have excessive AMCs that are normally caused by "chemical additives" to achieve required surface resistivity or SR to avoid ESD events, (2) Moisture vapors not removed prior to shipment/storage, (3) The Moisture Vapor Transmission Rate or MVTR assigned to said enclosures and (4) Enclosures lacking adequate MVTR will cause transition vapors to also become conveyors of AMCs to mobilize and cause corrosive damage to bond pads during shipment phases.

The solution to the problem must start with certifiable knowledge of ionic contaminant levels of packaging materials such as cushion and separators specified used for packaging wafers within coin stacked shipping boxes so as to compare with known levels of ionic contaminants that corrode bond pads. The levels must be expressed in terms of Maximum Limits that AMC are allowed within said boxes that associate with packaging material supplied, and the limits must be established by the individual manufacturer that fabricates the wafer thus satisfying established specification that address the issue of ionic contamination for packaging materials used for packaging wafers within shipping boxes.

The Quality Assurance Program, according to the present invention, is designed in a manner whereby boxes/containers and each and every original part to including cushions, bumpers and separators of a wafer box is specifically designed to address the issues of side to side wafer movement, breakage, moisture vapors and corrosive damage. These parts are certified by a qualified laboratory to guarantee that AMC Maximum Limits will not be exceeded under a Warranty Program and that all like items by Lot Number will be replaced.

The certification is based on the product being randomly removed from a production line as a sample to be tested and will represent a quantity by which said confidence level is established. Each sample is tested by wet extraction methods for not less than one (1) hour to obtain impurities using a solution diluted by a factor greater than or less than one (1). In accordance with the CP System, Invention, test results by said wet extraction method will not exceed AMC Maximum Levels shown in TABLE 1 below. The measurements are made in parts per billion (ppb) and recorded in either $\mu g/g$ or $\mu g/cm2$ depending upon the reporting requirements that is specified by the end customer. The recording can then be certified to satisfy the end customer with a Quality Assurance Program that boxes/containers and all parts to include replacement parts being used in the Refurbish and Recycle Program, remain relatively free of corrosive contaminants that would otherwise reduce wafer yields during shipment phases.

TABLE 1

MAXIMUM LIMIT AMC'S ALLOWED

| Typical | Maximum Limit (µg/g) For WEC Boxes & Components | | |
|---|---|---|---|
| Contaminants | Bumpers | Cushions | Separators |
| Fluorine (F) | <2 | <1 | <2 |
| Chloride (Cl) | <4 | <2 | <2 |
| Nitrite (NO2) | <4 | <2 | <2 |
| Bromide (Br) | <4 | <2 | <4 |
| Nitrate (NO3) | <4 | <10 | <2 |
| Phosphate (PO4) | <2 | <0.5 | <2 |
| Sulfate (SO4) | <4 | <2 | <2 |
| Sodium (Na) | <4 | <4 | <0.7 |
| Ammonium (NH4) | <20 | <0.6 | <20 |
| Potassium (K) | <4 | <4 | <0.5 |
| Calcium (Ca) | <4 | <4 | <3 |

Figure 57:
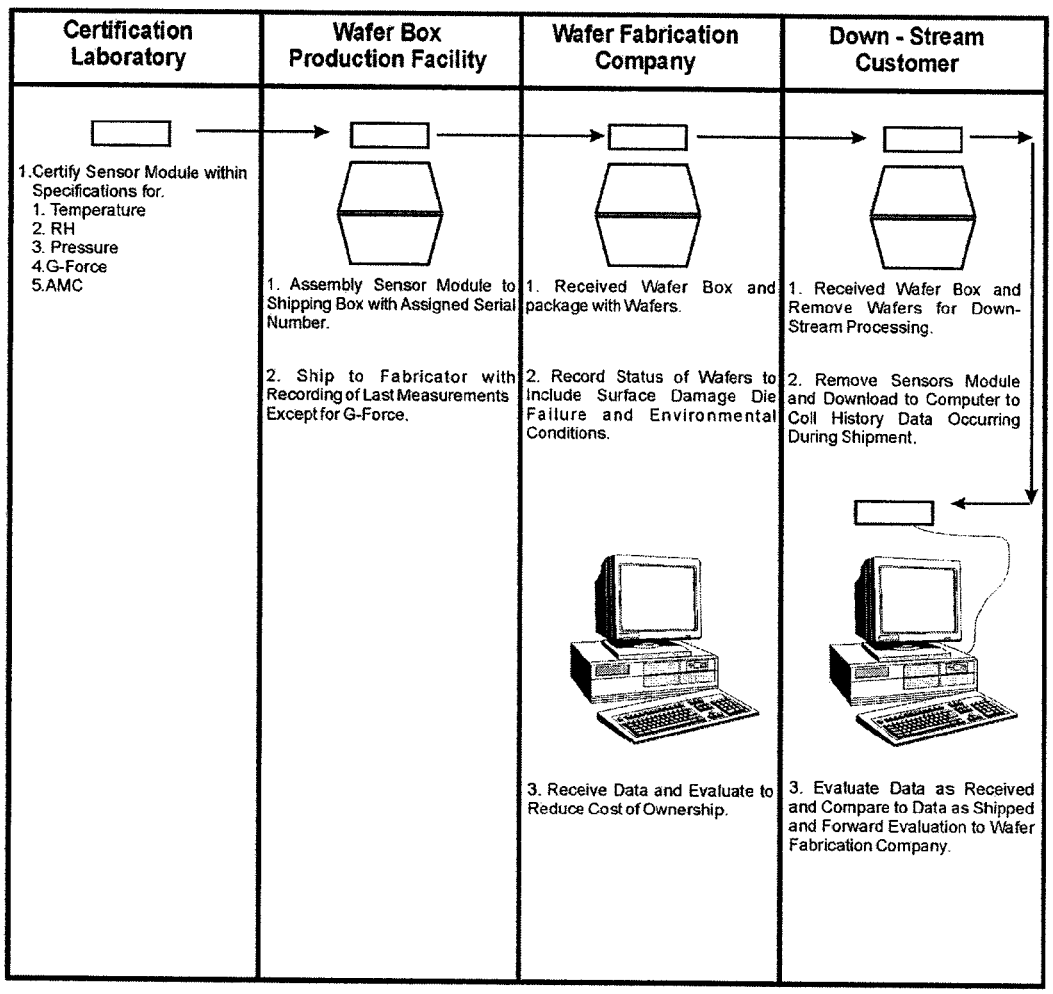
FIG. 57 is a Chart illustrating Critical Factor (AMCs) Monitoring Program for containers during shipment phases in real time.

FIG. 57 shows a Critical Factor Monitoring Program designed to protect sensitive articles from damage, contamination, or any event that may compromise final yields or quality of the end product that has certified documented properties, can have a sensor that can be used to track and provide data to end customers. This allows a comparison to known data prior to shipment. Any container can only provide protection within certain bounds of its environment and conditions. For instance, if a container and packaging system is designed to provide protection from breakage at a maximum impact force of 10G, it would be good information if the receiver of the shipment had information relating to the forces the container was subject to during shipment. There may be reason to take additional steps in the next process step if it is known the container was subjected to a force of 12G even though there is no evidence of damage. In a similar respect, if a container had documented specifications that out gassing AMC contaminants would be with acceptable levels over a specific range of temperature, humidity and pressure, being able to provide the data to the customer as to the environmental conditions the shipment was subject too could have a considerable impact on decisions required for final process.

The objective of the present invention is to provide a shipping container for sensitive articles that contains sensors, a real time clock and a memory device that can store all conditions said container has been subjected to during transport. This information, along with software that contains all the parameters of the container capabilities, can be used to make decisions regarding the next steps in reducing Cost of Ownership that relates directly to increase yields. There are already commercially available sensor devices for recording: 1) g-force; 2) AMCs and 3) combinable humidity, temperature and pressure. These devices can be arranged as a module to adapt to wafer shipping boxes. The arrangement becomes the basis for a Quality Assurance Program for wafers packaged within bags/boxes/containers being transported from one location to another location as demonstrated in FIG. 57.

Figure 58:
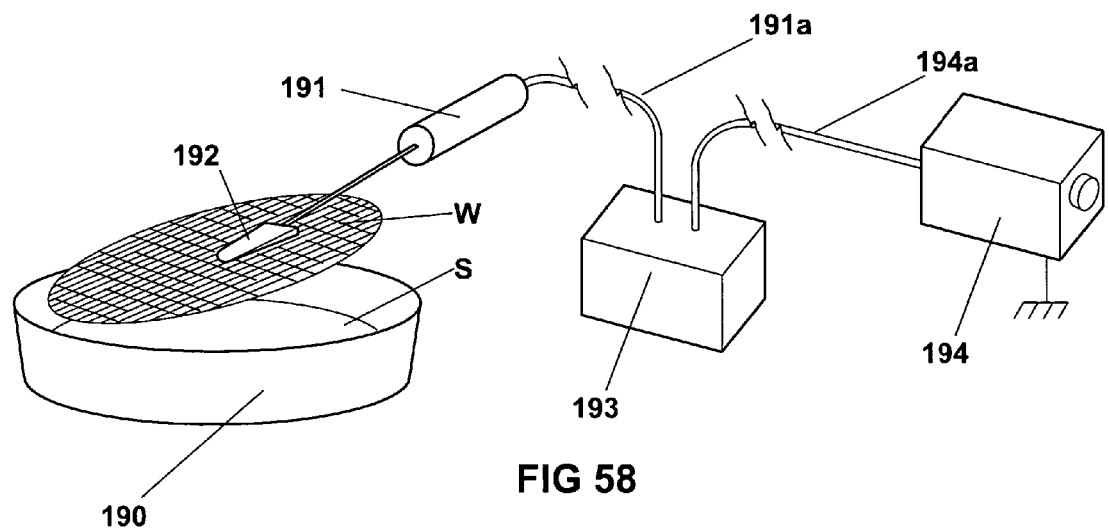
FIGS. 58-60 illustrate an apparatus and method for insertion of wafers in a wafer shipping box.
Figure 59:
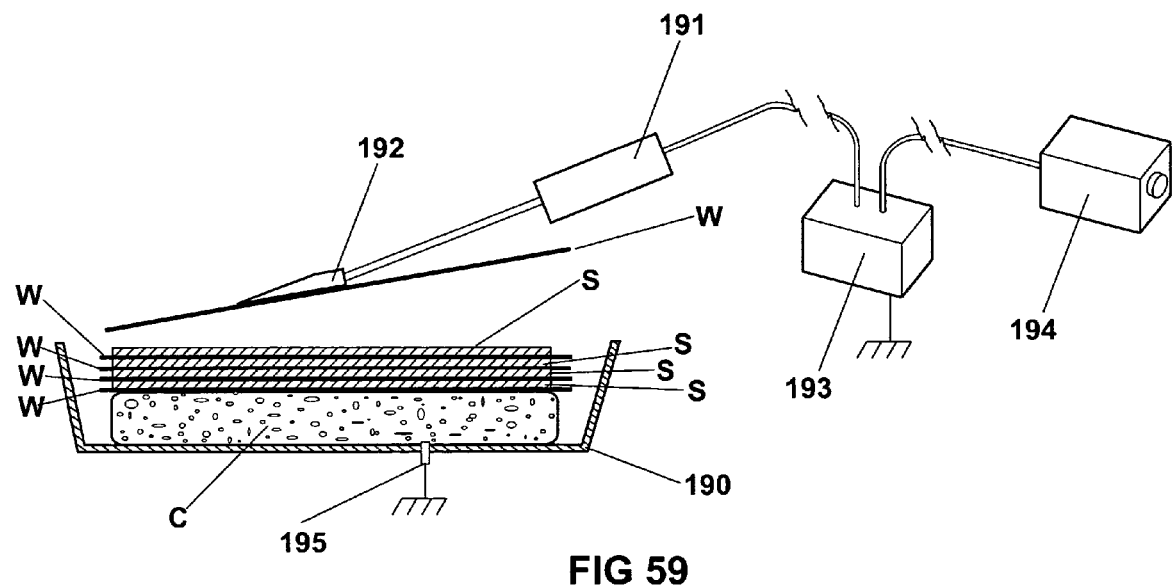
Figure 60:
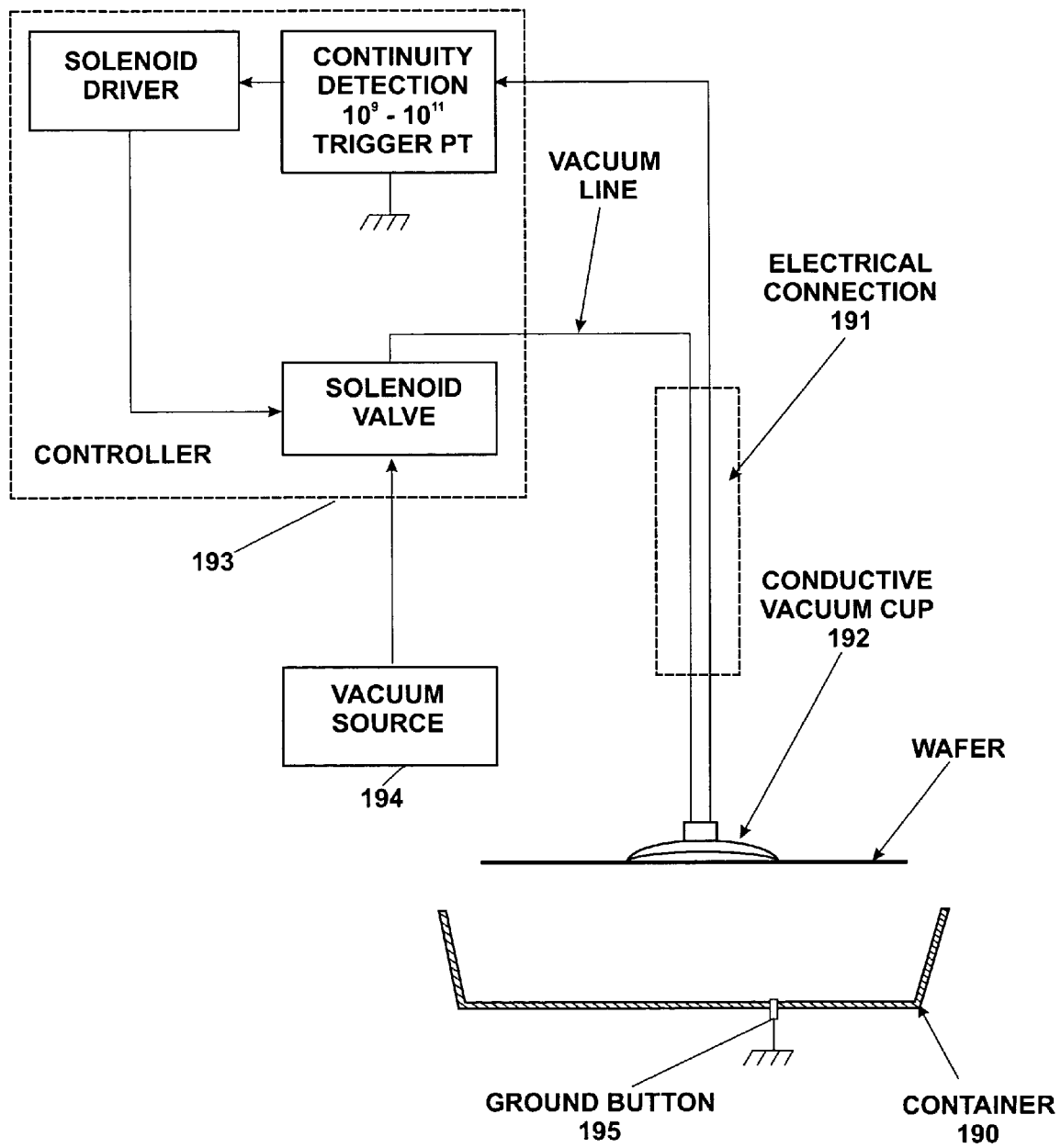

The certification Laboratory prepares a certified sensor module for recording various parameters. The sensor is assembled to a wafer shipping box/container which has an assigned serial number, and is shipped to the wafer fabrication company. The status and environmental condition of one or more wafers package in the wafer box/container is recorded and then shipped to the down stream wafer customer. The recorded data is evaluated to see what can be done to reduce costs and prevent wafer damage. The down stream customer removes the wafers from the wafer box/container removes the sensor module and down loads the data collected during shipment. This date is forwarded to the wafer fabrication company to compare to the data to the data as shipped. This evaluation helps to determine conditions during shipment so that cause of damage, if any, can be determine and eliminated. FIGS. 58-60 illustrate an apparatus and method for the insertion of wafers within a wafer shipment box/container without scratching the wafers. Semiconductor wafers need to be transported from facility to facility for test and/or packaging. In doing so they are packaged in protective containers, usually with protective anti static separators between wafers. When placed in the container manually with a vacuum pickup device, it is difficult for the operator to determine the proximity of the transported wafer to the bottom of the container, or the previously inserted wafer. As a result, if the wafer is dropped too soon by releasing the vacuum, the wafer becomes air borne during distance of the fall, often in an erratic motion, which results in scratching the wafer.

The present invention detects the moment of contact of a silicon wafer being inserted into a shipping container by manual or automatic means. Either or both means has an end-effecter that is conductive to sense a "touch" contact between packaged separator S and wafer W being inserted into bottom cover 190 as shown in FIGS. 58-59. The manual system shown in the views of FIG. 58 and FIG. 59, consist of a vacuum wand 191, controller 193, bottom cover 190, and vacuum source 194. Wand 191 has a conductive end-effecter 192 which is connected to controller 193 by hose 191a. Controller 193 connects to vacuum source by hose 194a. Controller 193 has a solenoid valve (FIG. 60) which shuts off vacuum source 194 when wafer W touches separator S.

Prior art end-effecters are connected to a vacuum source that can be vented to atmosphere when it is desired to release said wafer during inserting procedures. However, this method results in scratch damage due to the erratic free fall of said wafer to contact the next surface of the packaged separator in a rubbing manner. In comparison, FIG. 60 shows a schematic drawing having said wand 191 has a conductive end-effecter 192 that communicates directly with controller 193 having very low input current requirements. A regulated source of voltage (not shown) is connected to the wand 191 through a sense resistor, the voltage drop of which is applied differentially to the input of the amplifier. Current limiting resistors are connected either side of the differential amplifier to protect wafers from currents any greater than 1 µa in the event of a component failure. Whereby there will be an instant release of wafer W held by the end-effecter 192 of wand 191 that cause the vacuum source 194 to vent to the atmosphere. This occurs instantaneously when wafer W comes in contact with previously inserted separator S that alternately combines with previously inserted wafers W which retains a SR ranging from >10E5 to <10E11. These are typical resistivity values which provide conductivity to complete the circuit by which said wafer W is released from said wand 191. The instant release of the wafer W occurs when the very low voltage circuit communicates directly to the ground button 195 of the bottom cover 190 holding said wafers W with alternate separators S where a small current will flow generating a voltage across the sense resistor which is amplified by the instrumentation amplifier within wand 191 to a level consistent with detection by a voltage comparator that is also a component part of said controller 193. The voltage comparator triggers a solenoid driver that switches the wand from vacuum to atmosphere, thereby releasing the wafer at the instant of contact. As a matter of selection, and in accordance with the concepts of this invention, said bottom cover can be designed to be completely conductive to complete earth ground that could be same as controller 193 having earth ground to provide the same instant release of wafer W being held by wand 191.

This invention relates to a system that addresses the critical issues of packaging and shipping IC wafers from one location to another location, whereby said system employs a container holding one or more packaged wafers in a manner to reduce and/or restrict wafer motion that would otherwise cause abrasive damage to surfaces during shipment phases, whereas said system consists of a container having a top cover and a bottom cover so designed to freely accept one or more wafers, without obstructions, between the inner circumferences of said vertical members during packaging processes. Whereby said vertical members within a type of box have rubber bumpers and within another type of box have vertical members have thin extending membranes. In all selected containers, said vertical members will contact circumferential edges of packaged wafers with resiliency for the purpose to minimize forces that create motion during handling and shipping phases to cause damage to surfaces of substrates. Further, the system in accordance with this invention has multiple methods to address and correct the critical problems such as Lifting of Ball Bond Pads, Corrosive Damage to Bond Pads, Stained Bond Pads, Edge & Bevel Corrosive Damage, Damage to Substrate due to Shock Energy, etc., all of which become possibilities during packaging and shipment phases.

What is claimed:

1. A packaging/shipping container system for optimizing yields of sensitive articles, including semiconductor wafers with semiconductor dies thereon, during shipment and storage, comprising:
   a bottom cover with multiple vertical post assemblies, each assembly having a post and rubber type bumpers attached to the post, each rubber bumper has multiple fingers in an accordion type shape to directly contact edges of an article with resiliency without damage, the bumpers capable of moving independently of the respective post;
   a top cover having interior wall cams which cause the bumpers to move inward, when the top is placed over the bottom, causing contact between the bumpers with the edges of the packaged article;
   with the article located between a polymer spring and a cushion which prevent vertical motion of the article and damage to the article caused by shock energy and mishandling of the container.

2. The container system according to claim 1, further comprising:
   exterior resilient bumpers located around the periphery of at least one of the top or bottom covers.

3. A packaging/shipping container system for optimizing yields of sensitive articles, including semiconductor wafers with semiconductor dies thereon, during shipping and storage, comprising:
   a bottom cover with multiple vertical post assemblies, each assembly having attached rubber type bumpers, each rubber bumper has multiple fingers in an accordion type shape to directly contact edges of an article with resiliency without damage;
   a top cover having interior wall cams which cause the vertical post assemblies to flex and move inward, when the top is placed over the bottom, causing contact between the rubber type bumpers with the edges of the packaged article;
   the top cover cams cause the bumpers to move inwardly when the top is placed over the bottom;
   each bumper comprises a first leaf extending to a first side of a post and a second leaf extending to a second side of the post, the leaves moving radially inward when the top cover is placed over the bottom cover.

4. A packaging/shipping container system for optimizing yields of semiconductor articles, including semiconductor wafers with semiconductor dies thereon, during shipment and storage, comprising:
   a container bottom;
   a first cushion placed in the container bottom;
   a polymer compression spring for placement over said article; and
   a container top for joining to the container bottom for enclosing the article, the first cushion and the spring;
   resilient bumpers for contacting the edges of the articles, each bumper comprising a center and sides that extend from the center, the center being anchored and the sides capable of moving into contact with the edges of the articles;
   each bumper having associated therewith split cams on the container top, with one of the cams on one side of the bumper center and the other cam on the other side of the bumper center.

5. The container system according to claim 3, further comprising:
   the top cover cams for each bumper comprising dual cams that contact the first and second leaves.

6. The container system according to claim 5, further comprising:
   exterior resilient bumpers located around the periphery of at least one of the top or bottom covers.

7. A container for semiconductor wafers, comprising:
   a container bottom having a space for receiving a stack of wafers;
   pads located around a periphery of the wafer receiving space, the pads able to move in and out of the wafer receiving space; the pads contacting the wafer stack in the wafer receiving space when the pads have moved in;
   a container top which fits onto the container bottom, the container top has cams that cause the pads to move in when the container top is placed onto the container bottom;
   the pads comprise resilient bumpers with each bumper comprising a center and sides that extend from the center, the center being anchored and the sides capable of moving into contact with the wafer stack in the wafer receiving space;
   the cams further comprising split cams associated with each bumper, with one of the cams on one side of the bumper center and the other cam on the other side of the bumper center.

8. The container system according to claim 7, further comprising:
   exterior resilient bumpers located around the periphery of at least one of the top or bottom covers.

* * * * *